(12) United States Patent
Nosaka et al.

(10) Patent No.: US 11,165,421 B1
(45) Date of Patent: Nov. 2, 2021

(54) DRIVING CIRCUIT FOR SWITCHING ELEMENT AND SWITCHING CIRCUIT

(71) Applicant: OMRON Corporation, Kyoto (JP)

(72) Inventors: Noriyuki Nosaka, Nara (JP); Wataru Okada, Kizugawa (JP); Hironori Nakada, Nara (JP); Satoshi Iwai, Hirakata (JP)

(73) Assignee: OMRON CORPORATION, Kyoto (JP)

( * ) Notice: Subject to any disclaimer, the term of this patent is extended or adjusted under 35 U.S.C. 154(b) by 0 days.

(21) Appl. No.: 17/272,753

(22) PCT Filed: Mar. 14, 2019

(86) PCT No.: PCT/JP2019/010579
§ 371 (c)(1),
(2) Date: Mar. 2, 2021

(87) PCT Pub. No.: WO2020/084808
PCT Pub. Date: Apr. 30, 2020

(30) Foreign Application Priority Data

Oct. 26, 2018 (JP) .............................. JP2018-201845

(51) Int. Cl.
*H02M 1/08* (2006.01)
*H03K 17/16* (2006.01)

(52) U.S. Cl.
CPC ............ *H03K 17/165* (2013.01); *H02M 1/08* (2013.01)

(58) Field of Classification Search
CPC .............................. H02M 1/08; H03K 17/165

USPC .................................................. 327/108, 109
See application file for complete search history.

(56) References Cited

U.S. PATENT DOCUMENTS

| 6,661,276 | B1 * | 12/2003 | Chang | .............. H03K 17/04123 327/427 |
|---|---|---|---|---|
| 9,755,639 | B2 * | 9/2017 | Kampl | .................... H03K 17/74 |
| 11,031,935 | B2 * | 6/2021 | Arisawa | ............. H03K 17/6877 |
| 2012/0306545 | A1 * | 12/2012 | Machida | ................ H02M 1/08 327/109 |

(Continued)

FOREIGN PATENT DOCUMENTS

| JP | S58145091 U | 9/1983 |
|---|---|---|
| JP | 2013099133 A | 5/2013 |

(Continued)

OTHER PUBLICATIONS

International Search Report issued in Intl. Appln. No. PCT/JP2019/010579 dated Jun. 4, 2019. English translation provided.

(Continued)

*Primary Examiner* — William Hernandez
(74) *Attorney, Agent, or Firm* — Rossi, Kimms & McDowell LLP

(57) ABSTRACT

A switching element 1 has a gate terminal connected to an output end 123 of a driving circuit 12 via a capacitor 11 and a resistor 13 connected in parallel. The switching element 1 has a source terminal connected to the driving circuit 12 via a capacitor 14. A diode 15 connected in series with a resistor 16 has a cathode terminal connected to a section between the capacitor 11 and the resistor 13, and the gate terminal and an anode terminal connected, via the resistor 16, to a section between the source terminal and the capacitor 14.

10 Claims, 25 Drawing Sheets

(56) References Cited

U.S. PATENT DOCUMENTS

2014/0191784 A1* 7/2014 Hatanaka ............. H03K 17/691
                                                      327/109
2020/0389168 A1* 12/2020 Lee ..................... H03K 17/127

FOREIGN PATENT DOCUMENTS

| JP | 2014093586 A | 5/2014 |
| JP | 2018033303 A | 3/2018 |

OTHER PUBLICATIONS

Written Opinion issued in Intl. Appln. No. PCT/JP2019/010579 dated Jun. 4, 2019. English translation provided.

* cited by examiner

DRIVING CIRCUIT FOR SWITCHING ELEMENT AND SWITCHING CIRCUIT

TECHNICAL FIELD

The present invention relates to a driving circuit for a switching element.

BACKGROUND ART

A technique in which a JFET or the like made from silicon carbide (SiC) is used as a switching element in a power converter or the like has been proposed in the related art. In a driving circuit for such a switching element, in order to prevent malfunctions, a capacitor is provided between a gate and source of the switching element, the capacitor being larger in capacitance than a stray capacitance generated between the drain and the gate. Further, in order to prevent malfunctions, a technique for applying negative bias by using a speed-up capacitor CgD has been proposed (see, for example, Patent Document 1). Similarly, a technique for applying negative bias by using a Zener diode has been proposed (see, for example, Patent Document 2).

The application of negative bias for a driving circuit for the above-described switching element known in the related art may cause an unwanted phenomenon where a reverse conduction loss due to an internal diode of the switching element increases in proportion to a negative bias voltage. The reverse conduction loss is also proportional to a frequency; therefore, when a switching frequency is increased, the increase in reverse conduction loss becomes a problem.

PRIOR ART DOCUMENTS

Patent Documents

Patent Document 1: Japanese Unexamined Patent Publication No. 2013-99133
Patent Document 2: Japanese Unexamined Patent Publication No. 2014-93586

SUMMARY OF THE INVENTION

Problems to be Solved by the Invention

The present invention has been made in view of the above-described problems, and it is therefore an object of the present invention to provide a technique for allowing a driving circuit for a switching element to reduce a loss due to a negative bias voltage.

Means for Solving the Problem

Provided according to the present invention for solving the above-described problems is a driving circuit for a switching element configured to drive a switching element, the driving circuit for a switching element including a controller having a first terminal and a second terminal, the controller being configured to output a control signal to a gate terminal of the switching element, a first resistor connected to the first terminal of the controller, the first resistor regulating a current serving as the control signal, a first capacitor connected in parallel to the first resistor, a second capacitor, a second resistor, a diode connected in series with the second resistor, and a current path extending from the first resistor and the first capacitor to the gate terminal and from a source terminal of the switching element to the second terminal of the controller, the second capacitor is put in the path extending from the source terminal to the controller, and the diode connected in series with the second resistor has a cathode terminal connected to a path extending from the first resistor and the first capacitor to the gate terminal and an anode terminal connected to a path extending from the source terminal to the second capacitor.

According to the present invention, input capacitances of the first capacitor, the second capacitor, and the switching element are charged by the current serving as the control signal when the switching element is in the gate-on state, and the electric charge thus stored is discharged via the first resistor and the second resistor when the switching element is in the gate-off state, thereby applying a negative bias voltage to the switching element. The negative bias voltage depends on the duty cycle at which the switching element turns on and off, so that causing the negative bias voltage to change in a manner that depends on the duty cycle allows a reduction in loss.

Further, according to the present invention, when a capacitance of the first capacitor is denoted by C1, a capacitance of the second capacitor is denoted by C2, an input capacitance of the switching element is denoted by Ciss, a source voltage of the control signal is denoted by Vdd, a gate-source voltage when the switching element is in a turn-on state is denoted by Vdev, and a negative bias voltage applied to the switching element is denoted by Vcc, $$\frac{1}{Ciss} * \frac{1}{\left(\frac{1}{C1} + \frac{1}{C2} + \frac{1}{Ciss}\right)} < \frac{Vcc + Vdev}{Vdd} \qquad [\text{Math. 1}]$$

may be satisfied.

This makes it possible to attenuate the negative bias voltage in two steps. This in turn makes it possible to set the negative bias voltage to prevent sudden changes in voltage and current.

Further, according to the present invention, a third resistor may be connected between the gate terminal and the source terminal of the switching element.

This makes the negative bias voltage variable in a manner that depends on not only the duty cycle, but also the resistance value of the third resistor.

Further, according to the present invention, the switching element may be of either a current-driven type or a voltage-driven type.

In the driving circuit for a switching element according to the present invention, the second capacitor is charged by the current flowing from the controller to the switching element via the first resistor and the first capacitor, so that, in a switching element of a current-driven type, the current for charging the second capacitor flows from the source terminal of the switching element. Further, in a switching element of a voltage-driven type, the current for charging the second capacitor flows through the third resistor. As described above, the present invention is applicable to not only the switching element of a current-driven type but also the switching element of a voltage-driven type. Examples of the switching element of a current-driven type include a transistor, a JFET, and the like, and examples of the switching element of a voltage-driven type include a MOSFET, an IGBT, and the like, but are not limited to such elements.

Further, according to the present invention, a third capacitor may be connected between the gate terminal and the source terminal of the switching element.

This makes the negative bias voltage variable in a manner that depends on not only the duty cycle, but also the resistance value of the third resistor.

Further, according to the present invention, a mirror clamping circuit may be provided in parallel to a path including the switching element and the second capacitor.

This makes it possible to prevent a large voltage such as a surge voltage from being applied to the switching element.

Further, according to the present invention, a fourth resistor connected to the path in series with the first capacitor and in parallel to the first resistor may be provided.

This allows the fourth resistor to reduce a gate surge of the switching element. This further allows a reduction in switching noise caused in the switching element.

Further, according to the present invention, a Schottky diode may be provided, the Schottky diode having a cathode terminal connected to a path adjacent to the first resistor and the first capacitor and an anode terminal connected to a path adjacent to the controller, relative to the second resistor and the switching element.

This allows a reduction in gate surge of the switching element. Here, the second capacitor and the switching element are connected in series on the path. The Schottky diode has the cathode terminal and the anode terminal connected to the path across the second capacitor and the switching element.

Further, according to the present invention, a voltage clamping unit configured to fix a voltage to a predetermined voltage may be connected in parallel to the switching element.

This allows the voltage clamping unit to fix the gate voltage applied to the switching element to a predetermined voltage, thereby allowing a reduction in gate surge.

Here, as the voltage clamping unit, for example, a Zener diode may be used.

Further, provided according to the present invention is a switching circuit including a plurality of switching elements connected in series, and a driving circuit for a switching element configured to drive each of the plurality of switching elements.

According to the present invention, it is possible to reduce a loss by making the negative bias voltage in a gate-off state variable in a manner that depends on a change in duty cycle in the switching elements constituting the switching circuit.

Effect of the Invention

According to the present invention, the driving circuit for a switching element can reduce a loss due to a negative bias voltage.

MODE FOR CARRYING OUT THE INVENTION

Application Example

Figure 1:
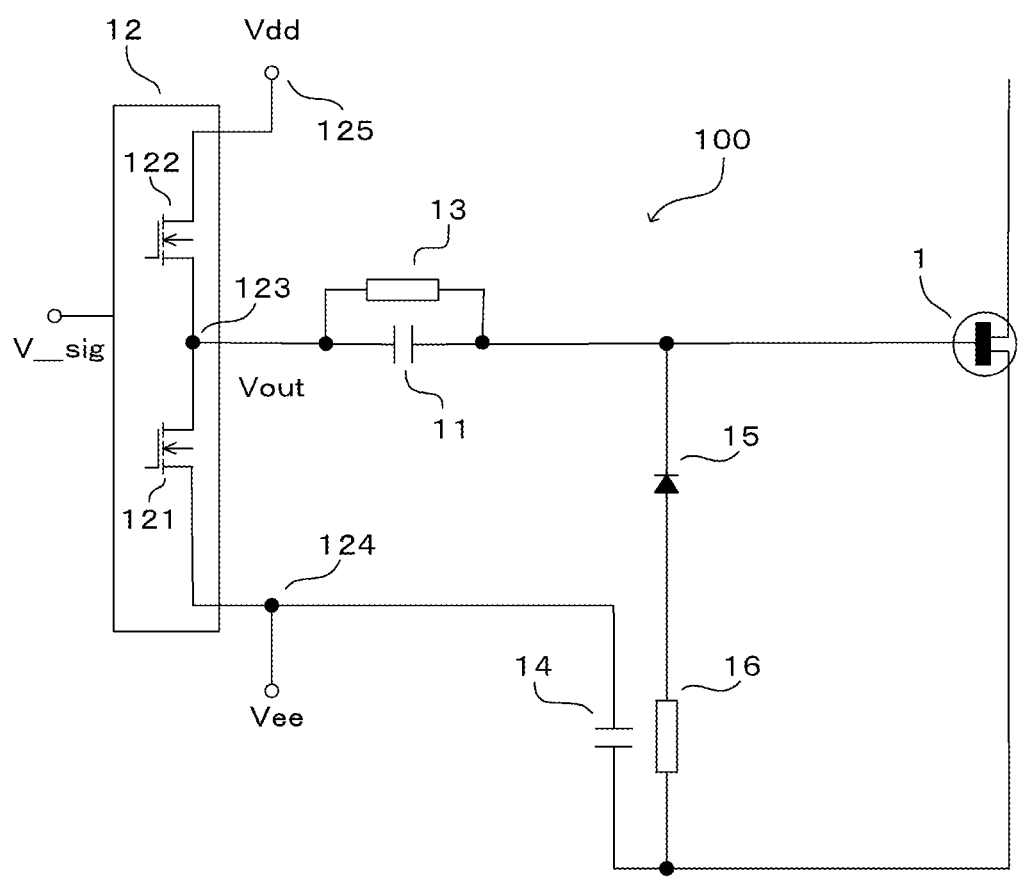
FIG. 1 is a diagram showing a circuit structure of a gate driving circuit 100 according to a first embodiment.

Hereinafter, an application example of the present invention will be described with reference to the drawings. The present invention is applied to, for example, a gate driving circuit 100 for a switching element as shown in FIG. 1.

In the switching element 1, a negative bias voltage is applied to prevent false turn-on when the switching element is in the gate-off state due to, for example, noise generated from another switching element connected in series with the switching element 1.

Figure 20:
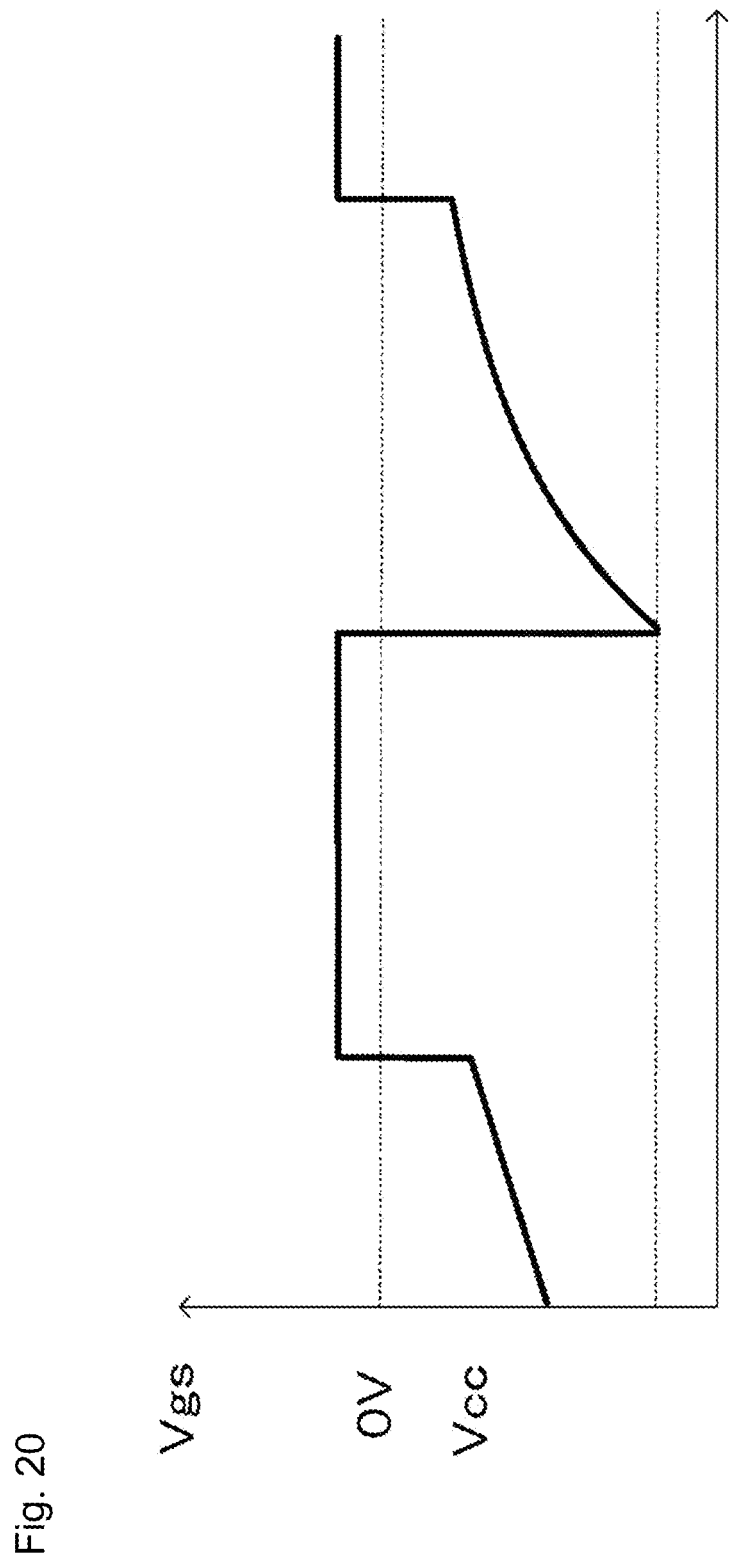
FIG. 20 is a graph showing a profile of a gate voltage applied to a switching element according to an example known in the related art.

As such a negative bias voltage, a voltage having a profile as shown in FIG. 20 is applied across the gate and the source. It is desirable to increase the negative bias voltage in order to prevent false turn-on, but simply increasing the negative bias voltage will lead to an increase in loss, as will be described later.

The present invention is therefore intended to reduce a loss by suitably changing the negative bias voltage. At this time, the negative bias voltage may be changed for prevention of malfunctions, which is the primary purpose of applying the negative bias voltage to the switching element.

Figure 3:
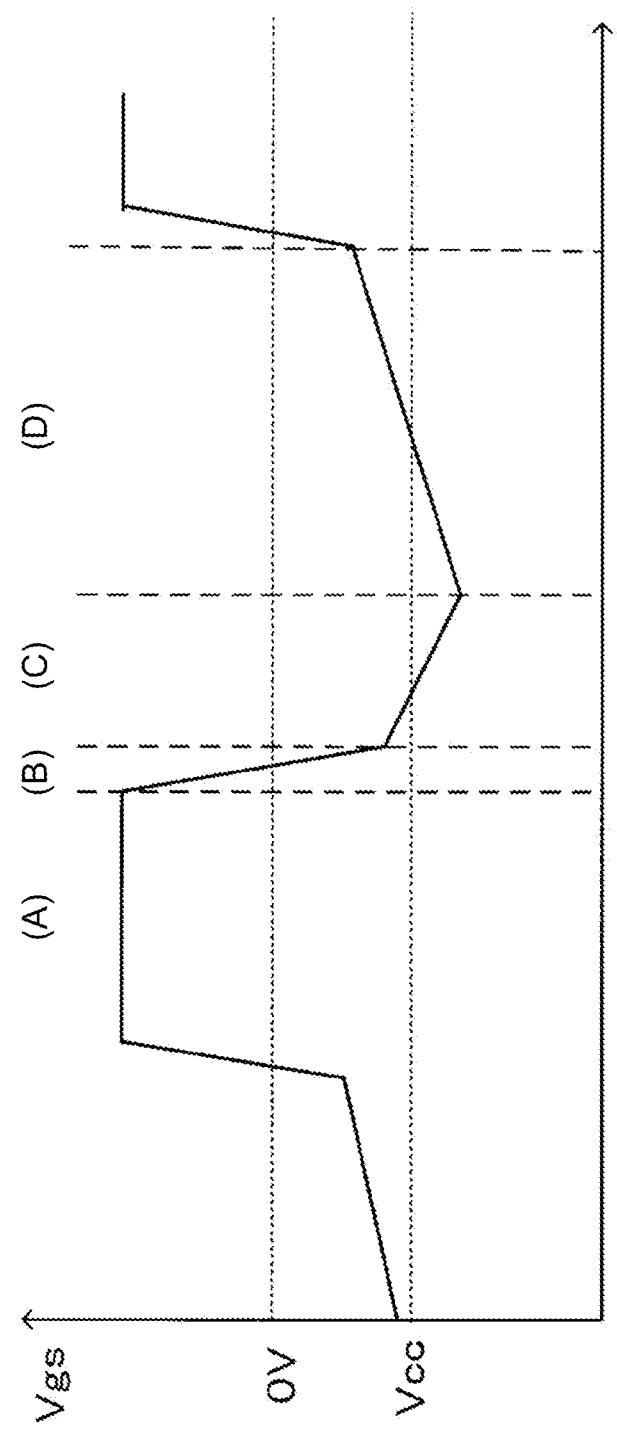
FIG. 3 is a graph showing a profile of a gate voltage applied to a switching element 1 according to the first embodiment.

When the negative bias voltage is applied by the gate driving circuit shown in FIG. 1, a gate-source voltage Vgs applied to the switching element has a profile as shown in FIG. 3. According to the present invention, a first resistor regulating a gate current supplied to the switching element and a first capacitor connected in parallel to the first resistor are provided. The first resistor and the first capacitor are referred to as a limiting resistor and a speed-up capacitor, respectively.

A current serving as a control signal output from a controller for controlling the gate of the switching element flows to a gate terminal of the switching element via the limiting resistor and the speed-up capacitor. Then, this current flows to the controller through a source terminal of the switching element. According to the present invention, putting a second capacitor in a current path extending to the controller via the limiting resistor, the speed-up capacitor, and the switching element and connecting a second register and a diode in series such that the diode has a cathode terminal connected to a path extending from the first resistor and the first capacitor to the gate terminal and an anode terminal connected to a path extending from the source terminal to the second capacitor make the negative bias voltage variable in a manner that depends on the duty cycle.

The speed-up capacitor connected in series with the path, an input capacitance of the switching element, and the second capacitor are charged by the gate current flowing when the switching element is in the gate-on state, and the electric charge thus stored is discharged via the limiting resistor and the second resistor when the switching element is in the gate-off state. The negative bias voltage having the profile shown in FIG. 3 is applied by the discharge of the electric charge stored in the speed-up capacitor, the input capacitance of the switching element, and the second capacitor.

As will be described later, Vcc denoting an average value of the negative bias voltage depends on the duty cycle at which the switching element turns on and off, so that the negative bias voltage is variable in a manner that depends on the duty cycle. Further, Vcc also depends on the resistance value of the second resistor, so that the negative bias voltage is variable in a manner that depends on the resistance value of the second resistor.

The present invention is further applicable to a switching circuit including switching elements connected in series and driven by the driving circuit according to the present invention. In such a switching circuit, even when a surge voltage or noise occurs due to, with a switching element in the off state, complementary turn-on of another switching element, suitably changing the negative bias voltage makes it possible to prevent malfunctions such as false turn-on. Further, even when a large current flows to the switching element, suitably changing the negative bias voltage allows a reduction in loss. As described above, various effects can be brought about by applying, to the switching circuit, the driving circuit in which a bias is variable. Such a switching circuit only needs to be a circuit having a plurality of switching elements connected in series for switching, and examples of the switching circuit include, but are not limited to, a synchronous rectification boost chopper circuit, a DC/DC converter, an inverter, and the like.

First Embodiment

Hereinafter, a gate driving circuit according to an embodiment of the present invention will be described in more detail with reference to the drawings.
<Device Structure>
FIG. 1 shows the gate driving circuit 100 according to the embodiment.

The switching element 1 has a gate terminal connected to a first end of a capacitor 11 serving as a speed-up capacitor. The capacitor 11 has a second end connected to a terminal 123 (hereinafter referred to as "Vout end") from which an output voltage Vout of a driving circuit 12 is output. A resistor 13 serving as a limiting resistor that allows a minute current to flow when the switching element 1 is on is connected in parallel to the capacitor 11. The switching element 1 has a source terminal connected to a first end of a capacitor 14. The capacitor 14 has a second end connected to a terminal 124 (hereinafter referred to as "Vee end") of the driving circuit 12. Then, a diode 15 and a resistor 16 connected in series are connected to a section between the gate terminal of the switching element 1 and the first ends of the capacitor 11 and the resistor 13 and to a section between the source terminal of the switching element 1 and the first end of the capacitor 14. The diode 15 has a cathode terminal connected to a section adjacent to the gate and an anode terminal connected to a first end of the resistor 16, and the resistor 16 has a second end connected to a section adjacent to the source of the switching element 1. The driving circuit 12 includes two n-channel MOSFETs 121, 122 connected in series between a terminal (hereinafter referred to as "Vdd end") 125 connected to a voltage source Vdd and the Vee end 124. A midpoint between the two MOSFETs 121, 122 is connected to the second ends of the capacitor 11 and the resistor 13 as a Vout end 123. The driving circuit 12 switches the MOSFETs 121, 122 between on and off in accordance with an input signal V_sig. Bringing the MOSFET 121 into the on state and bringing the MOSFET 122 into the off state cause the second end of the capacitor 11 to electrically connect to the Vdd end 125 via the Vout end 123 to allow a gate current to flow to the switching element 1 via the capacitor 11 and the resistor 13. Then, bringing the MOSFET 121 into the off state and bringing the MOSFET 122 into the on state cause the second end of the capacitor 11 to electrically connect to the Vee end 124 and the second end of the capacitor 14 via the Vout end 123 to apply the negative bias across the gate and source of the switching element 1. Here, the capacitor 11 serves as the first capacitor, the resistor 13 serves as the first resistor, the capacitor 14 serves as the second capacitor, the resistor 16 serves as the second resistor, the diode 15 connected in series with the resistor 16 serves as the diode connected in series with the second resistor, the driving circuit 12 serves as the controller, the Vout end 123 serves as a first terminal, and the Vee end 124 serves as a second terminal. Further, a circuit connected from the capacitor 11 and the resistor 13 to the gate terminal of the switching element 1 and from the source terminal of the switching element 1 to the driving circuit 12 corresponds to the path. Further, a current input into the gate terminal of the switching element 1 by switching the MOSFETs 121, 122 of the driving circuit 12 between on and off corresponds to the control signal.

Figure 2:
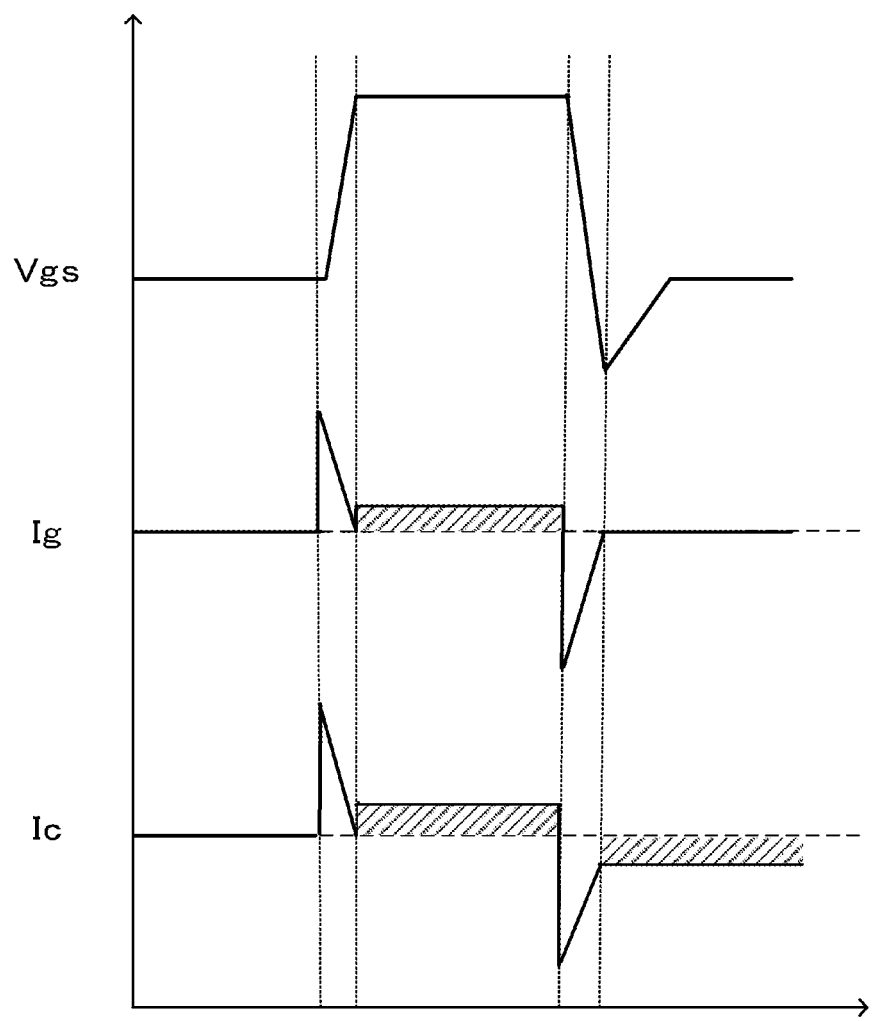
FIG. 2 is a diagram showing an operation principle of the gate driving circuit 100 according to the first embodiment.

<Operation Principle>
FIG. 2 shows the voltage (gate voltage) Vgs applied across the gate and source terminals of the switching element 1, a current Ig flowing to the gate terminal of the switching element 1, and a current Ic flowing to the capacitor 14. When a JFET is used as the switching element 1, the gate and source of the JFET are in ohmic contact, so that a current Igon constantly flows to the gate terminal in the turn-on state. This is expressed by:

[Math. 2]

$$Igon = (Vdd - Vdev - Vcc)/Rig$$

where Vdev denotes a voltage applied across the gate terminal and the source terminal in the turn-on state, and Rig denotes a resistance value of the resistor 13.

At this time, in the gate driving circuit 100, the current Ic flows to the capacitor 14.

When an electric charge stored in the capacitor 14 is denoted by Qcharge and an electric charge discharged from the capacitor 14 is denoted by Qdischarge, that the stored electric charge and the discharged electric charge are equal to each other is expressed by the following equation (1): This means that in a waveform of Ic shown in FIG. 2, two shaded regions surrounded by Ic and a coordinate axis are equal in area to each other.
[Math. 3]

$$Q\text{charge} = Q\text{discharge} \quad (1)$$

When the average value of the negative bias voltage is denoted by Vcc, the duty cycle is denoted by D, the frequency is denoted by f, the resistance value of the resistor 16 is denoted by R, and the charging current of the capacitor 14 in the turn-on state is denoted by Ic:
[Math. 4]

$$Q\text{charge} = \int Ic\, dt$$

[Math. 5]

$$Q\text{discharge} = \int (Vcc/R)\, dt$$

are satisfied. Therefore, the equation (1) can be expressed by:
[Math. 6]

$$\int Ic\, dt = \int (Vcc/R)\, dt$$

Integrating both sides results in:
[Math. 7]

$$Ic*D/f = (Vcc/R)*(1-D)/f \quad (2)$$

Rearrangement of the equation (2) for Vcc results in:
[Math. 8]

$$Vcc = R*Ic*D/(1-D) \quad (3)$$

Therefore, the negative bias voltage value Vcc is variable in a manner that depends on the duty cycle D and the resistance value R of the resistor 16.

A detailed description will be given below of the operation principle of the gate driving circuit.

FIG. 3 shows a profile of the gate voltage Vgs applied to the switching element 1 driven by the gate driving circuit 100.

An input capacitance of the capacitor 11, an input capacitance of the capacitor 14, and an input capacitance of the switching element 1 are denoted by C1, C2, and Ciss, respectively, and the gate-source voltage in the turn-on state is denoted by Vdev. As described above, Vdd denotes the gate source voltage, Vgs denotes the gate voltage, and Vcc denotes the negative bias voltage value.

Figure 4A:
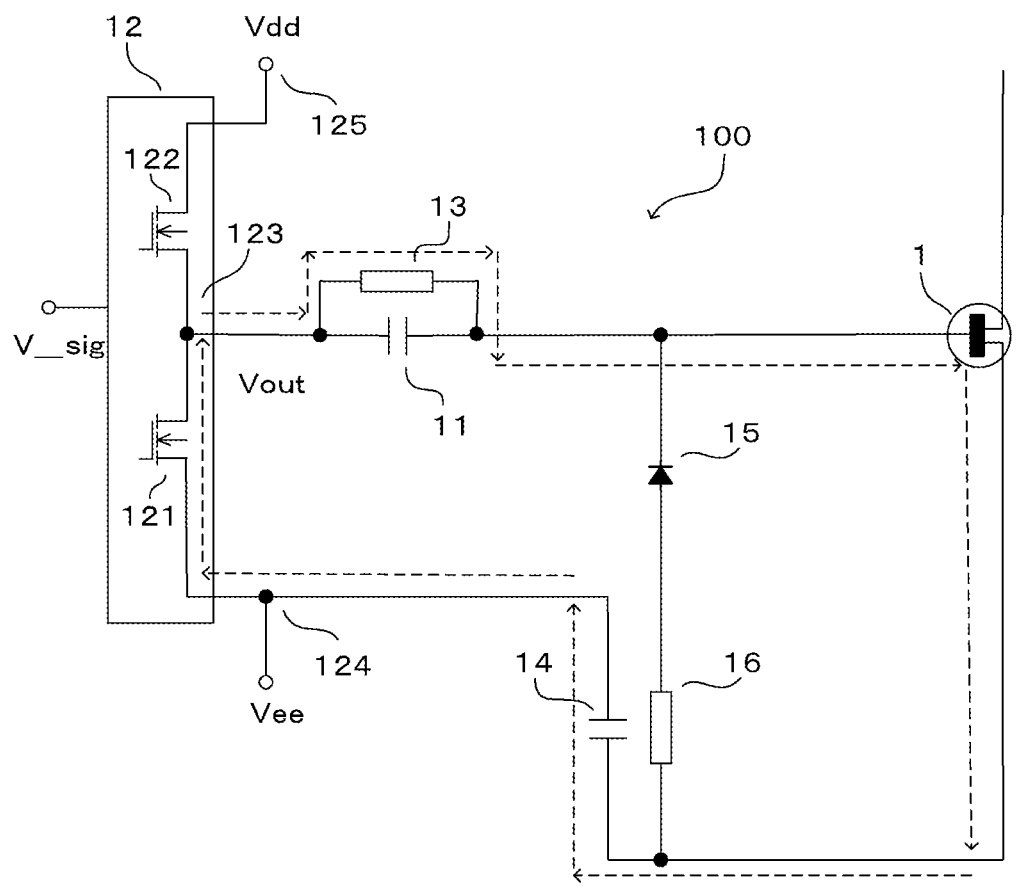
FIGS. 4A and 4B are diagrams showing, in a period (A), a current flow and a simple equivalent circuit of the driving circuit 100.
Figure 4B:
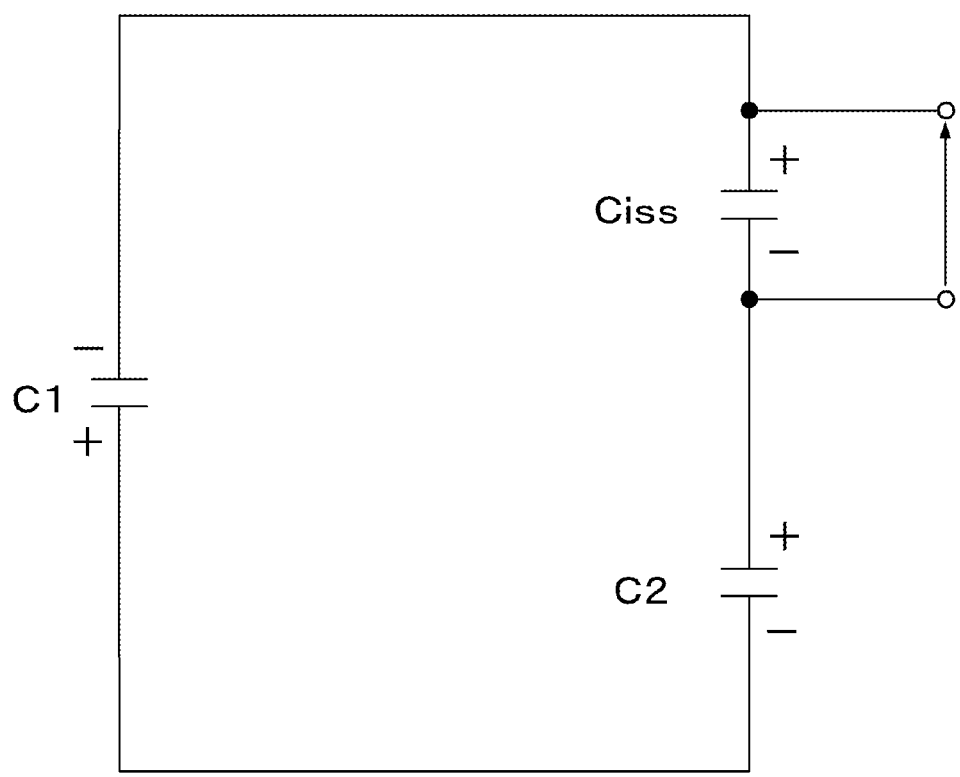

First, since the switching element 1 is a JFET, a steady-state on-current flows in a period, denoted by (A), when the gate is on. FIG. 4B shows a simple equivalent circuit, in this period, of a current flow path represented by dashed lines with arrows on the gate driving circuit 100 shown in FIG. 4A. At this time, an electric charge with polarities shown in the simple equivalent circuit of FIG. 4B is stored in the input capacitance of the capacitor 11, the input capacitance of the capacitor 14, and the input capacitance of the switching element 1.

Next, in a period denoted by (B), until the electric charge in the input capacitance of the capacitor 11, the electric charge in the input capacitance of the capacitor 14, and the electric charge in the input capacitance of the switching element 1 are in balance, charging and discharging of the electric charge continues. The input capacitance Ciss of the switching element 1 is charged in the negative direction, so that Vgs becomes small.

At this time, the gate voltage decreases in two steps by satisfying the following condition:

$$\frac{1}{Ciss} * \frac{1}{\left(\frac{1}{C1} + \frac{1}{C2} + \frac{1}{Ciss}\right)} < \frac{Vcc + Vdev}{Vdd}. \quad [\text{Math. 9}]$$

Figure 5A:
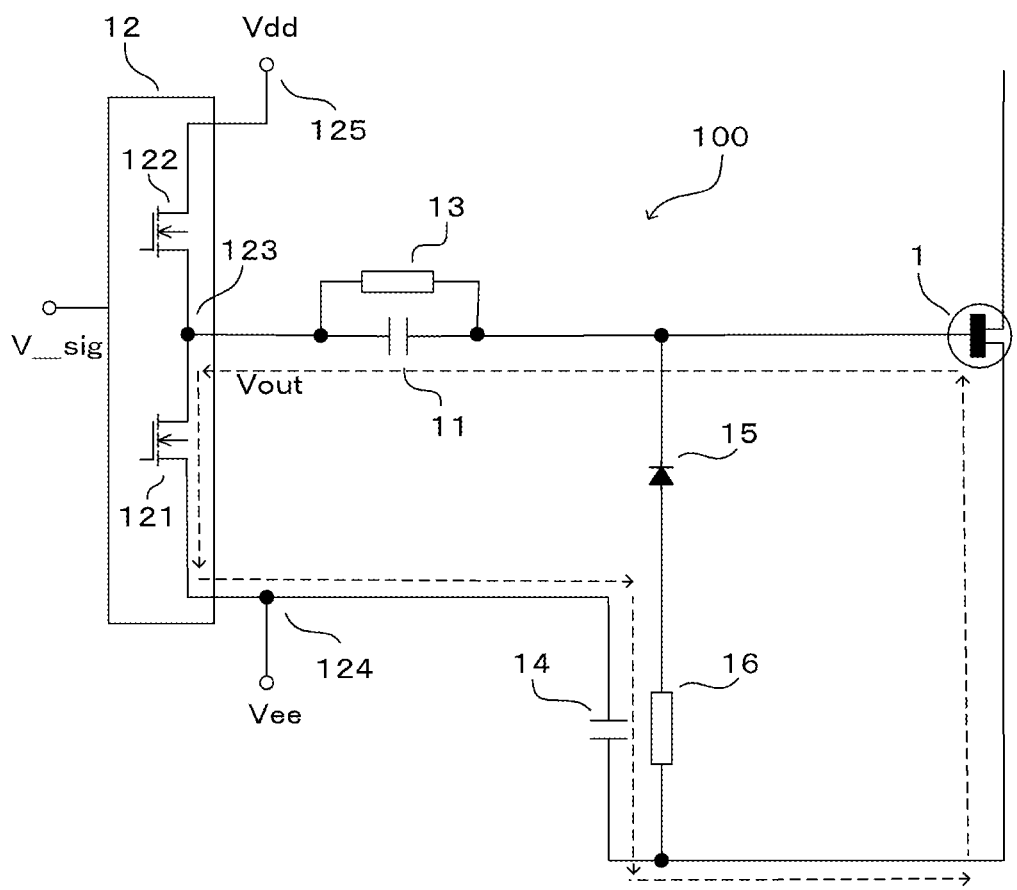
FIGS. 5A and 5B are diagrams showing, in a period (B), a current flow and a simple equivalent circuit of the driving circuit 100.
Figure 5B:
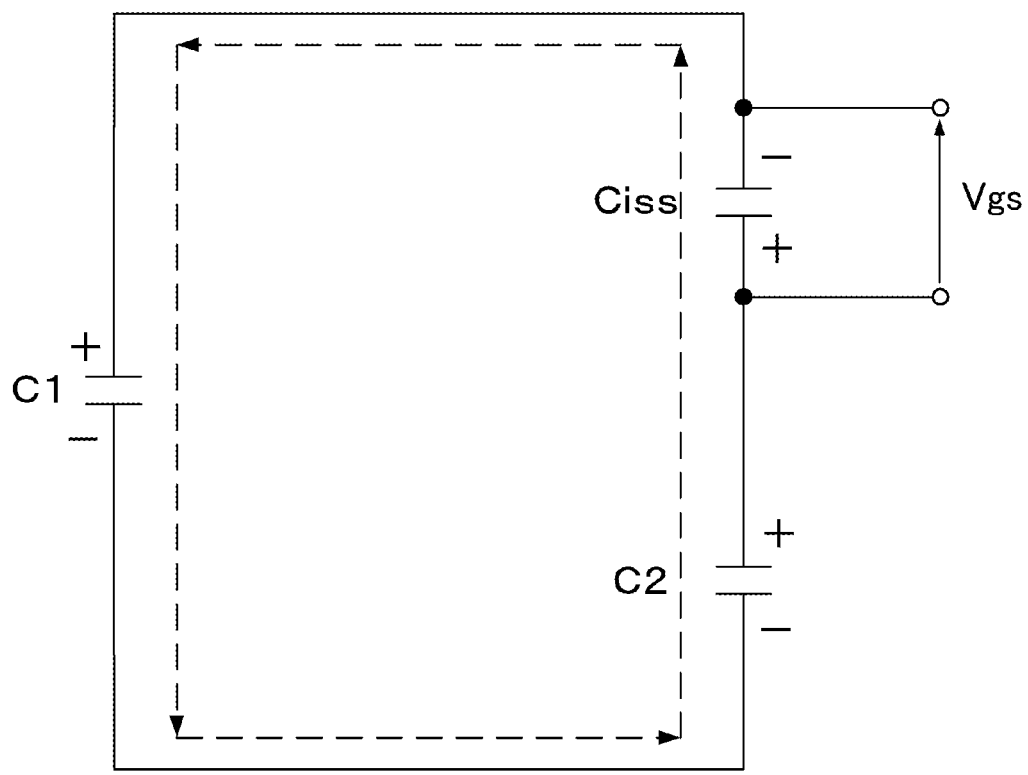

FIG. 5B shows a simple equivalent circuit, in this period, of a current flow path represented by dashed lines with arrows on the gate driving circuit shown in FIG. 5A. The polarities of the electric charges in the input capacitances of the capacitor 11, the capacitor 14, and the switching element 1 are shown in the simple equivalent circuit of FIG. 5B. Here, the current in the simple equivalent circuit is represented by dashed lines with arrows.

Figure 6A:
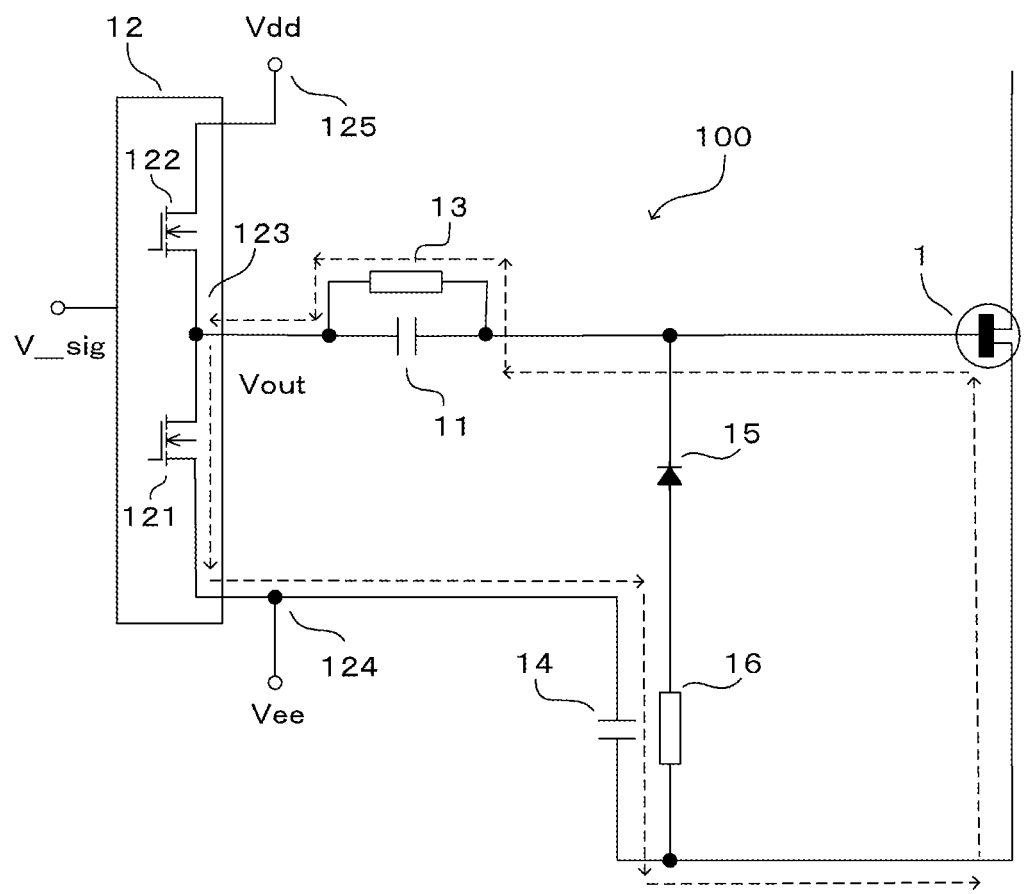
FIGS. 6A and 6B are diagrams showing, in a period (C), a current flow and a simple equivalent circuit of the driving circuit 100.
Figure 6B:
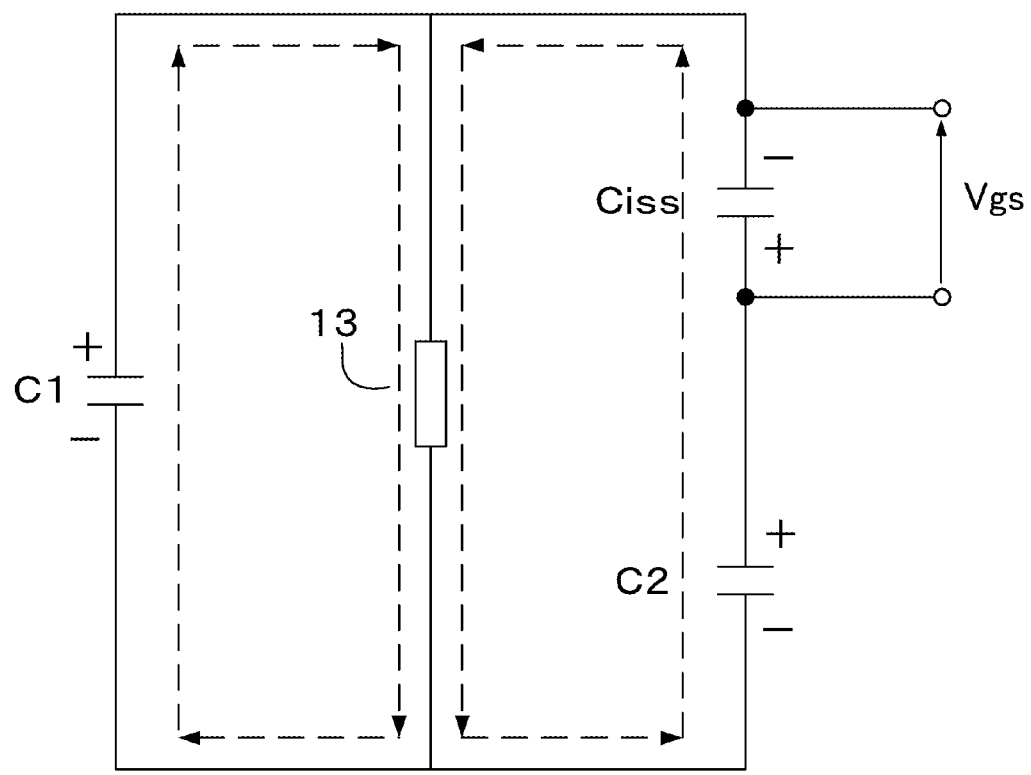

Next, in a period denoted by (C), the electric charge in the capacitor 11 is discharged via the resistor 13. FIG. 6B shows a simple equivalent circuit, in this period, of a current flow path represented by dashed lines with arrows on the gate driving circuit shown in FIG. 6A. In the simple equivalent circuit shown in FIG. 6B, the current flowing through the resistor 13 is represented by dashed lines with arrows. Discharging continues until the electric charge in the capacitor 11 becomes zero. At this time, the switching element 1 is charged in the negative direction, so that the gate voltage Vgs becomes small.

Figure 7A:
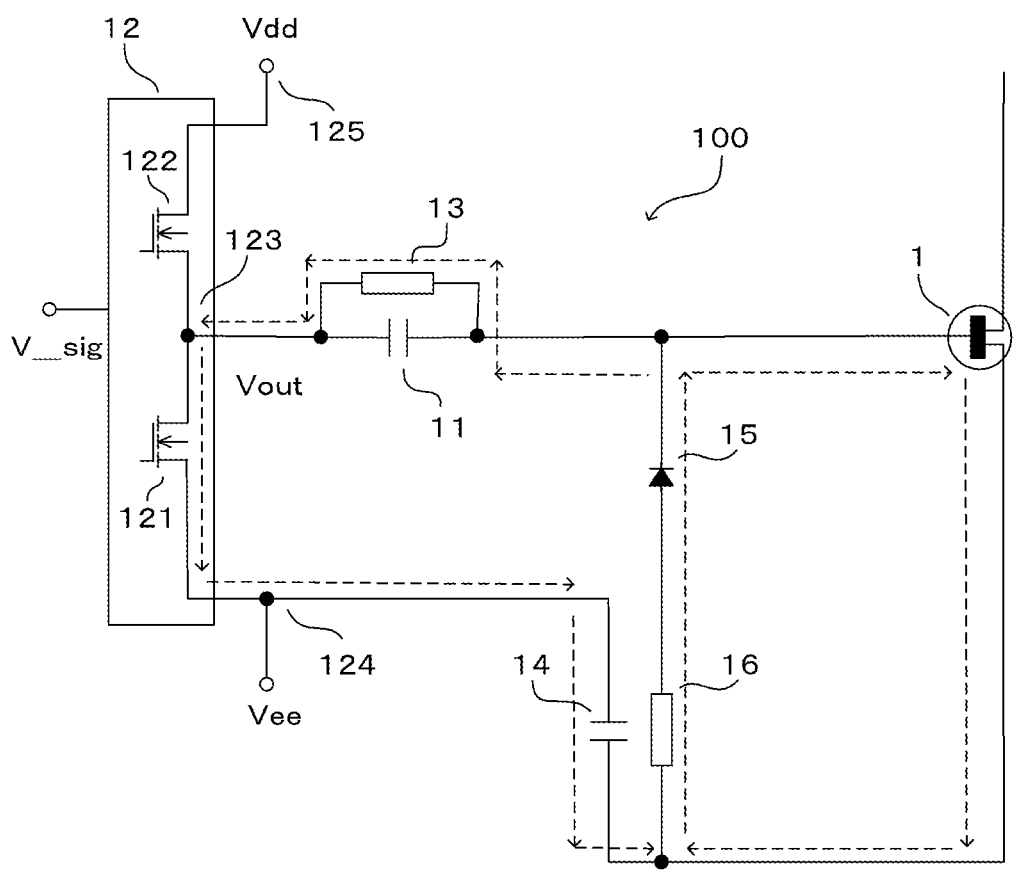
FIGS. 7A and 7B are diagrams showing, in a period (D), a current flow and a simple equivalent circuit of the driving circuit 100.
Figure 7B:
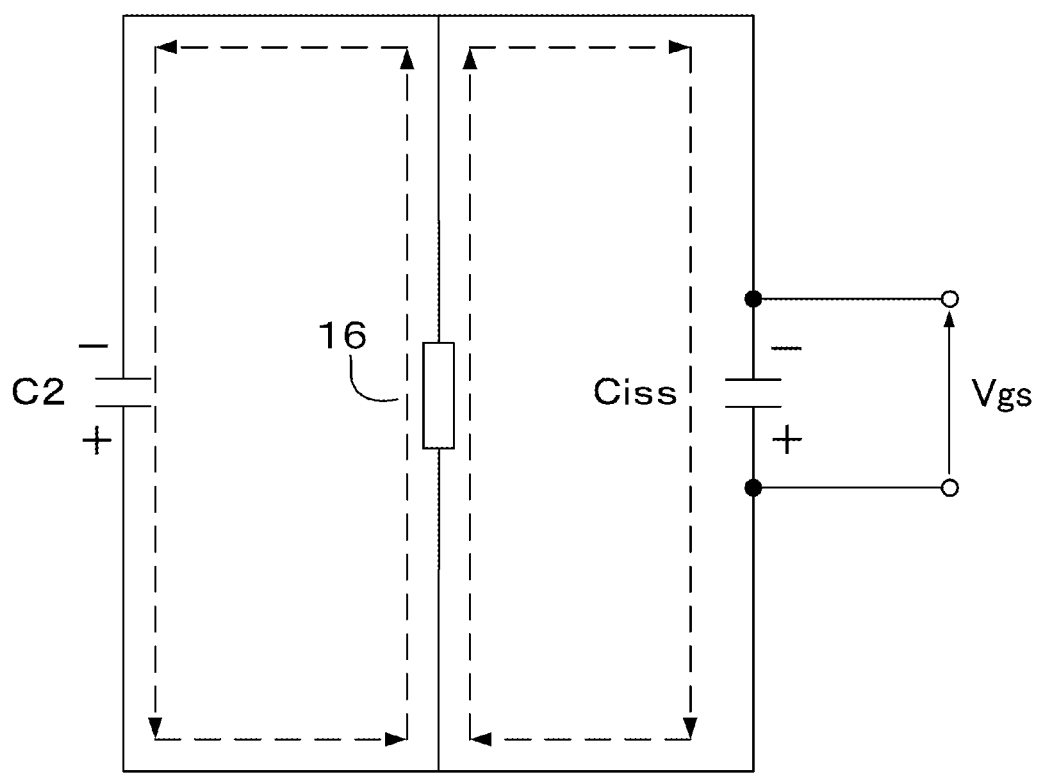

Next, in a period denoted by (D), the electric charge in the capacitor 14 is discharged via the resistor 16. FIG. 7B shows a simple equivalent circuit, in this period, of a current flow path represented by dashed lines with arrows on the gate driving circuit shown in FIG. 7A. The electric charge in the switching element 1 is discharged, so that the gate voltage Vgs increases in the positive direction.

As described above, in the gate driving circuit 100 according to the embodiment, the negative bias voltage value is variable in a manner that depends on a change in the duty cycle. This allows a reduction in loss caused during a dead-time period (during a reverse conduction period) while preventing the switching element 1 from malfunctioning. Further, according to the embodiment, the gate voltage can be regulated with the profile as shown in FIG. 3. The gate voltage is attenuated in two steps when the switching element 1 is in the gate-off state as in the periods (B) and (C), thereby allowing a reduction in gate surge and allowing a reduction in noise.

Second Embodiment

Figure 8:
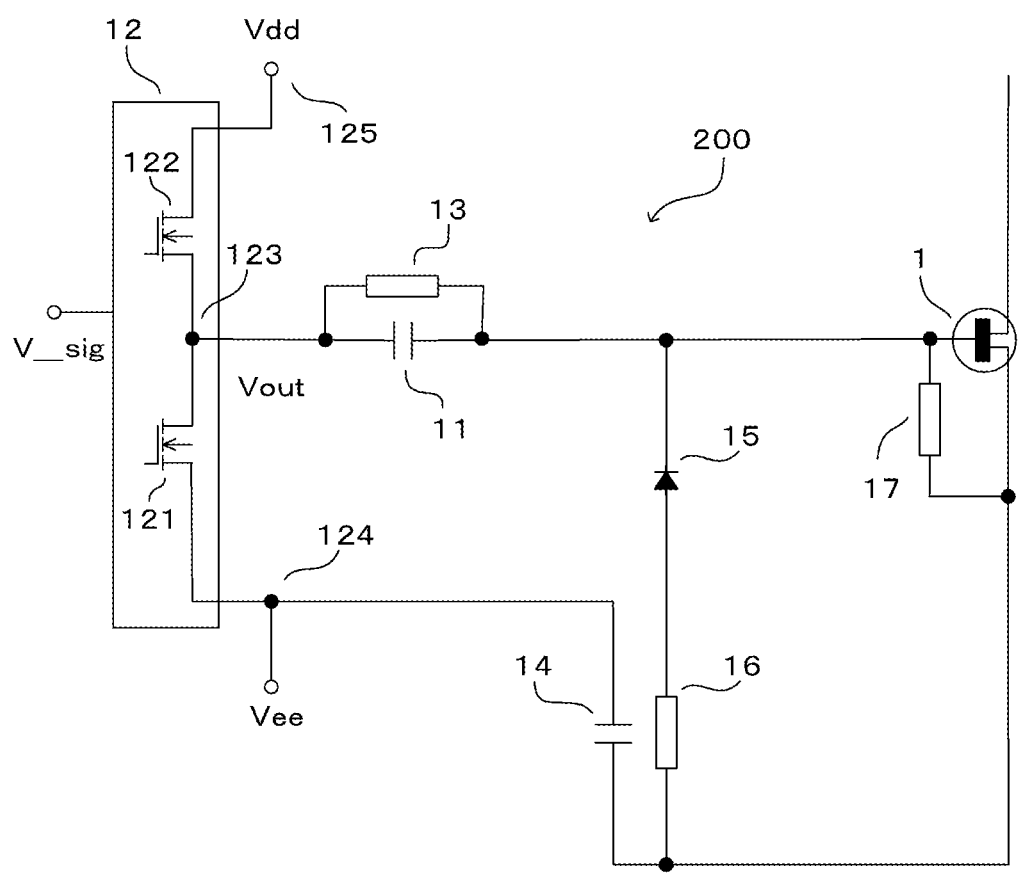
FIG. 8 is a diagram showing a circuit structure of a gate driving circuit 200 according to a second embodiment.

FIG. 8 shows a gate driving circuit 200 according to a second embodiment of the present invention.

The same components as in the first embodiment are denoted by the same reference numerals, and thus no detail description will be given of the components.

According to the embodiment, a resistor 17 is connected in parallel between the gate and source of the switching element 1. The resistor 17 has a first end connected to a section between the gate terminal of the switching element 1 and the cathode terminal of the diode 15. The resistor 17 has a second end connected to a section between the source terminal of the switching element 1 and the second end of the resistor 16. Here, the resistor 17 corresponds to the third resistor.

According to the embodiment, the negative bias voltage value applied to the switching element 1 is variable in a manner that depends on not only the duty cycle as in the first embodiment, but also the resistance value of the resistor 17.

According to the embodiment, a change in the negative bias voltage value applied to the switching element 1 allows a reduction in loss while preventing the switching element 1 from malfunctioning.

Further, connecting the resistor 17 in parallel between the gate and source of the switching element 1 as described above allows the capacitor 14 to be charged even when a switching element of a voltage-driven type such as a MOSFET or an IGBT is used as the switching element 1, thereby setting the negative bias voltage value variable in a manner that depends on the duty cycle. Therefore, it is possible even for a gate driving circuit for a switching element of a voltage-driven type to reduce a loss while preventing malfunctions.

Third Embodiment

Figure 9:
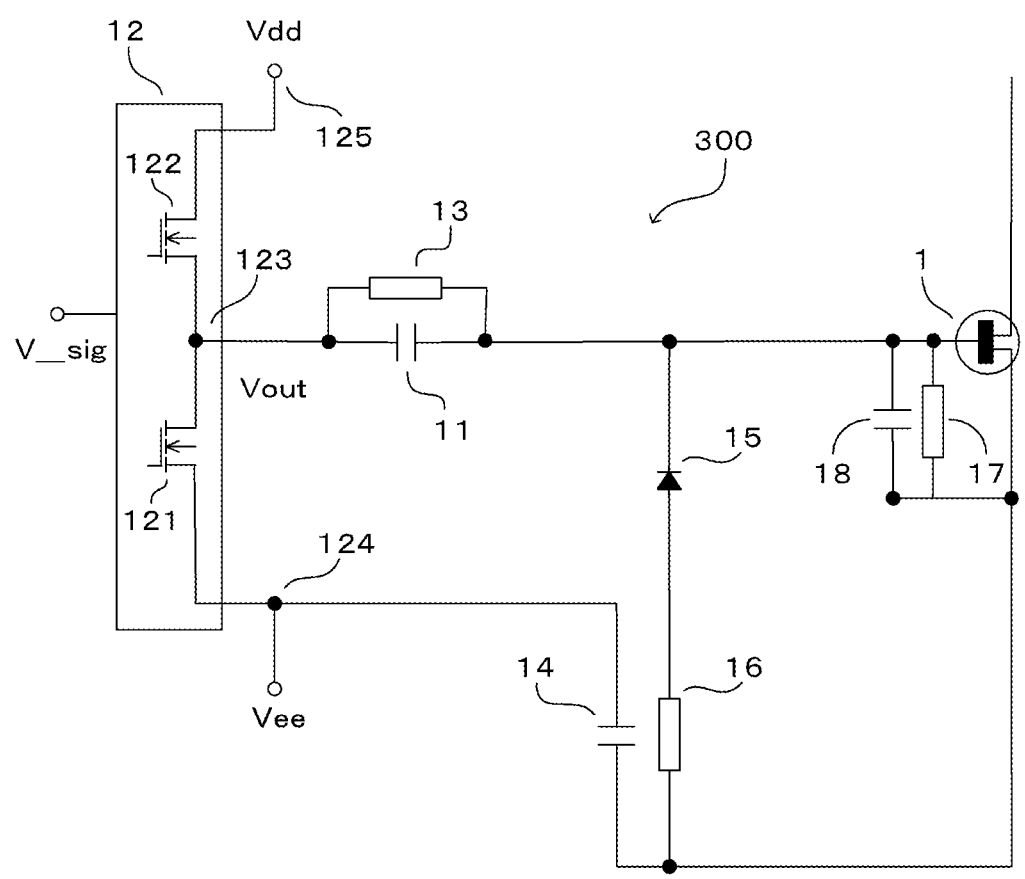
FIG. 9 is a diagram showing a circuit structure of a gate driving circuit 300 according to a third embodiment.

FIG. 9 shows a gate driving circuit according to a third embodiment of the present invention.

The same components as in the second embodiment are denoted by the same reference numerals, and thus no description will be given of the components.

According to the embodiment, a capacitor 18 is connected in parallel to the resistor 17 connected between the gate and source of the switching element 1 according to the third embodiment. Here, the capacitor 18 corresponds to a third capacitor.

According to the embodiment, the negative bias voltage value applied to the switching element 1 is variable in a manner that depends on not only the duty cycle as in the first embodiment or the resistance value of the resistor 17 as in the second embodiment, but also the capacitance value of the capacitor 18.

According to the embodiment, a change in the negative bias voltage value applied to the switching element 1 allows a reduction in loss while preventing the switching element 1 from malfunctioning.

This further makes the switching speed of the switching element 1 variable in a manner that depends on the capacitance value of the capacitor 18.

Fourth Embodiment

Figure 10:
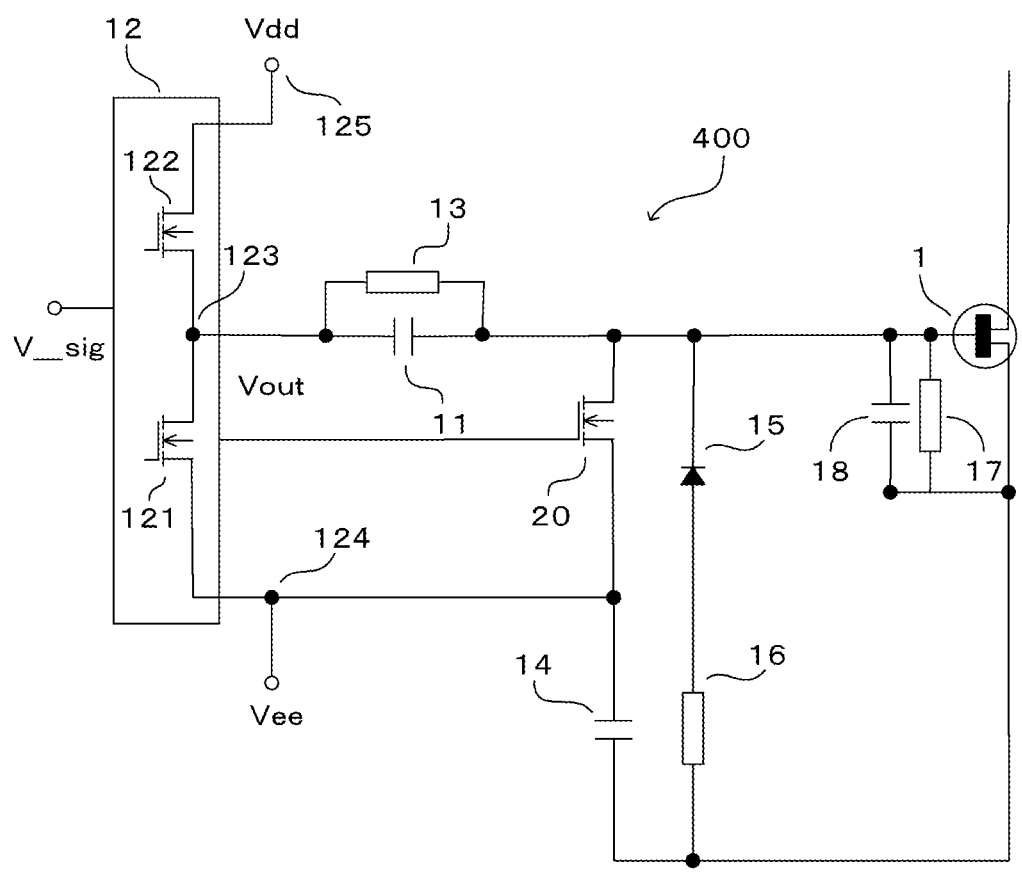
FIG. 10 is a diagram showing a circuit structure of a gate driving circuit 400 according to a fourth embodiment.

FIG. 10 shows a gate driving circuit 400 according to a fourth embodiment of the present invention.

The same components as in the third embodiment are denoted by the same reference numerals, and thus no detail description will be given of the components.

According to the embodiment, a switching element 20 is connected in parallel between the gate and source of the switching element 1. The switching element 20 is connected to a section between the cathode terminal of the diode 15 and the first ends of the capacitor 11 and the resistor 13 and to the second end of the capacitor 14. Here, an n-channel MOSFET is used as the switching element 20, and the switching element 20 has a drain terminal connected to the section between the cathode terminal of the diode 15 and the first ends of the capacitor 11 and resistor 13 and a source terminal connected to the second end of the capacitor 14. Further, the switching element 20 has a gate terminal connected to the driving circuit 12 and is controlled in accordance with a signal input from the driving circuit 12.

Figure 11:
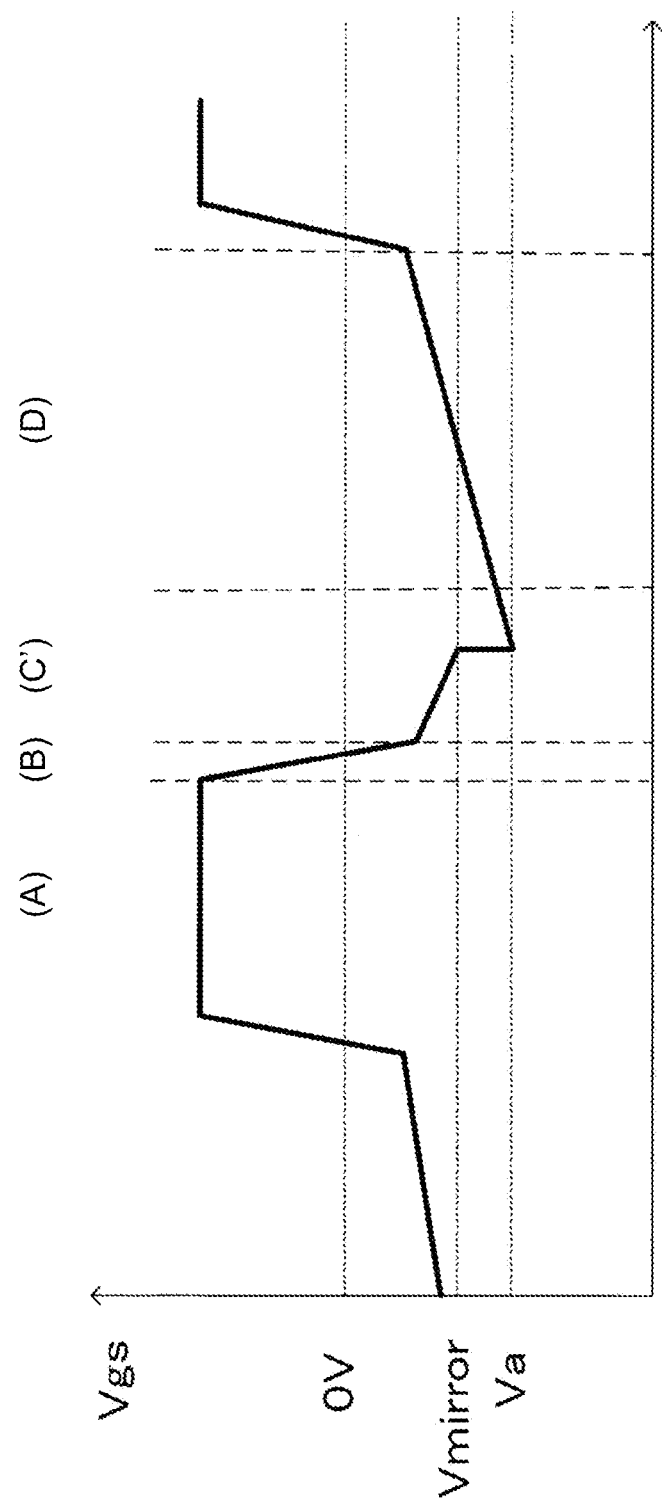
FIG. 11 is a graph showing a profile of a gate voltage applied to the switching element 1 according to the fourth embodiment.

The switching element 20 serves as a mirror clamping circuit. When the gate voltage Vgs is equal to or less than a Vmirror voltage (for example, Va (minimum negative bias voltage value)+2V), the switching element 20 turns on to set Vgs equal to Va. FIG. 11 shows a profile of the gate voltage Vgs applied to the switching element 1 driven by the gate driving circuit 400 according to the embodiment. In a period denoted by (C') shown in FIG. 11, as described above, when the gate voltage Vgs is equal to or less than Vmirror, the gate voltage Vgs is reduced to Va.

According to the embodiment, when the switching element is provided to cause the gate driving circuit 400 to serve as a gate driving circuit for a switching element of a synchronous rectification converter, increasing the negative bias voltage value when a switching element of the opposite arm is in the on state makes it possible to prevent false turn-on and reduce a gate surge. This further allows a reduction in conduction loss during the dead-time period.

Fifth Embodiment

Figure 12:
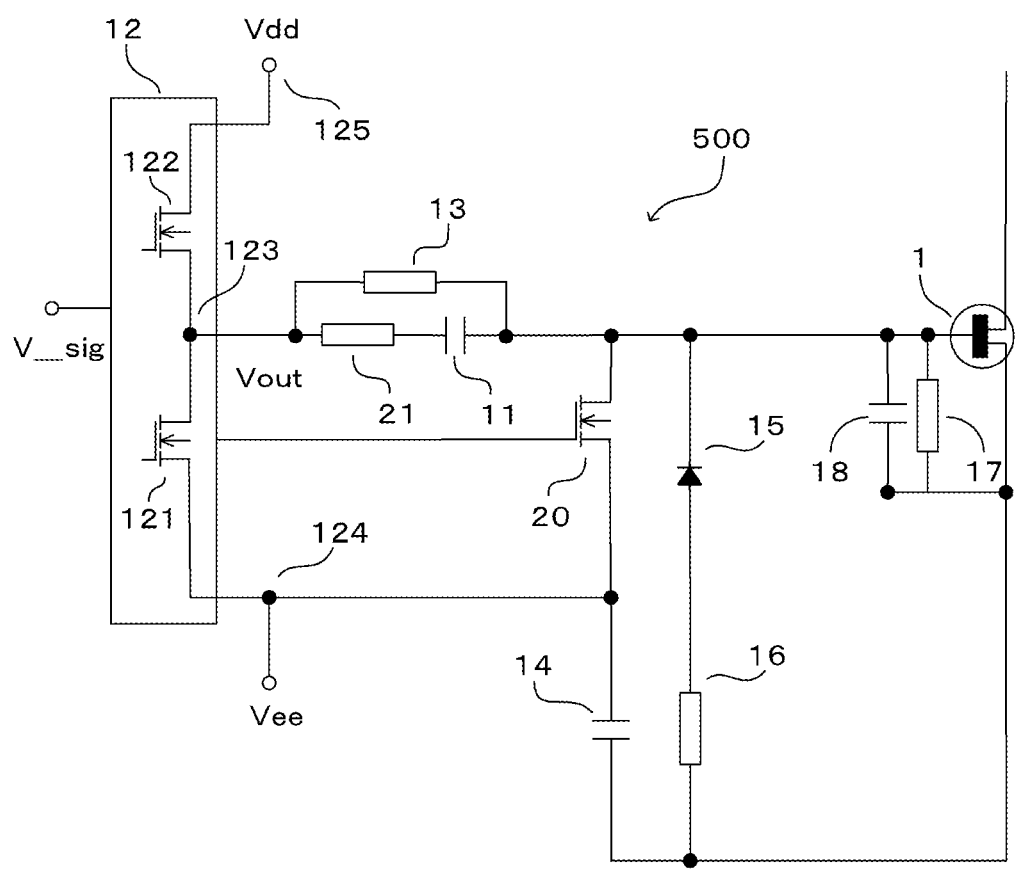
FIG. 12 is a diagram showing a circuit structure of a gate driving circuit 500 according to a fifth embodiment.

FIG. 12 shows a gate driving circuit 500 according to a fifth embodiment of the present invention.

The same components as in the fourth embodiment are denoted by the same reference numerals, and thus no description will be given of the components.

According to the embodiment, a resistor 21 is connected in series with the capacitor 11, and the resistor 13 is connected in parallel to the capacitor 11 and the resistor 21 connected in series. Here, the resistor 21 is connected adjacent to the Vout end 123 of the driving circuit 12 relative to the capacitor 11. Here, the resistor 21 corresponds to a fourth resistor.

According to the embodiment, the switching speed of the switching element 1 is variable in a manner that depends on a change in the resistance value of the resistor 21. This allows reductions in gate surge and switching noise.

Sixth Embodiment

Figure 13:
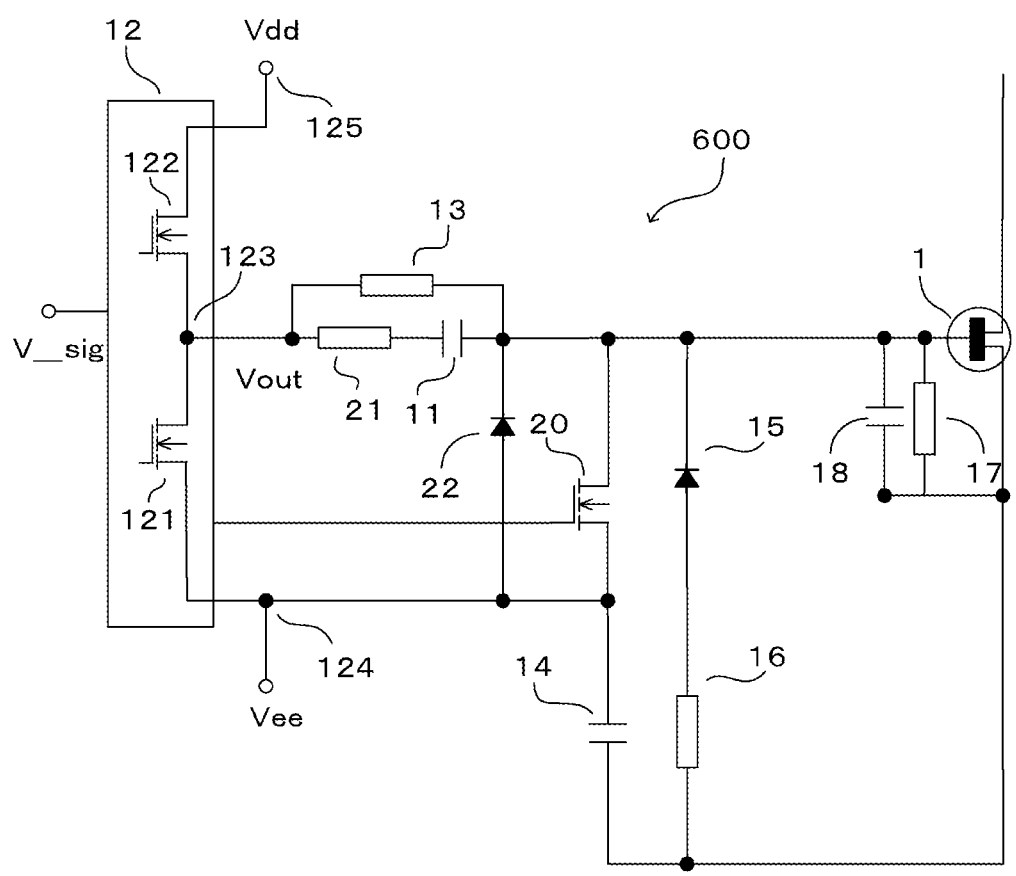
FIG. 13 is a diagram showing a circuit structure of a gate driving circuit 600 according to a sixth embodiment.

FIG. 13 shows a gate driving circuit 600 according to a sixth embodiment of the present invention.

The same components as in the fifth embodiment are denoted by the same reference numerals, and thus no description will be given of the components.

According to the embodiment, a Schottky diode 22 is connected to a section between the drain terminal of the switching element 20 and the first ends of the resistor 13 and the capacitor 11 and to a section between the source terminal of the switching element 20 and the Vee end 124. The Schottky diode 22 has a cathode terminal connected to a section adjacent to the gate terminal of the switching element 20 and an anode terminal connected to a section adjacent to the source terminal of the switching element 20. The addition of the Schottky diode 22 allows a reduction in gate surge.

Seventh Embodiment

Figure 14:
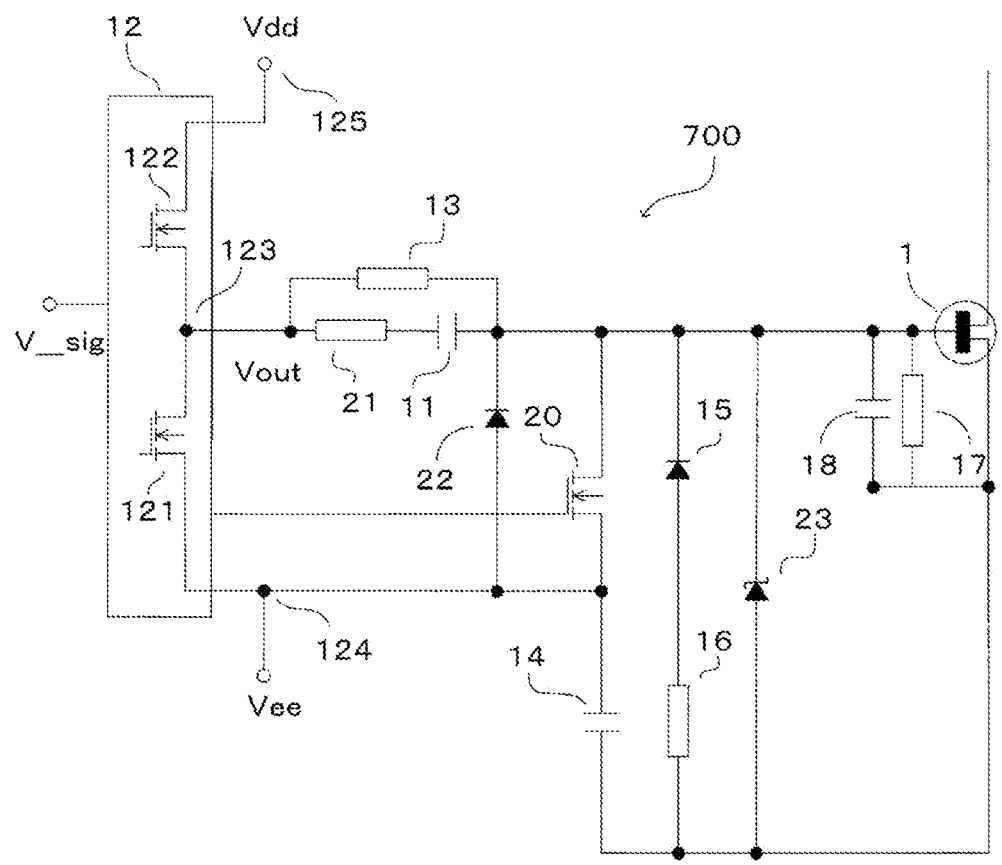
FIG. 14 is a diagram showing a circuit structure of a gate driving circuit 700 according to a seventh embodiment.

FIG. 14 shows a gate driving circuit 700 according to a seventh embodiment of the present invention.

The same components as in the sixth embodiment are denoted by the same reference numerals, and thus no description will be given of the components.

According to the embodiment, a Zener diode 23 is connected to a section between the first ends, adjacent to the gate terminal of the switching element 1, of the resistor 17 and capacitor 18 and the cathode terminal of the diode 15 and to a section between the second terminals, adjacent to the source terminal of the switching element 1, of the resistor 17 and capacitor 18 and the second end of the resistor 16. Here, the Zener diode 23 corresponds to a voltage clamping unit. The Zener diode 23 has a cathode terminal connected to a section adjacent to the gate terminal and an anode terminal connected to a section adjacent to the source terminal. The addition of the Zener diode 23 makes it possible to clamp a gate surge and reduce the gate surge.

[Simulation]

Figure 15:
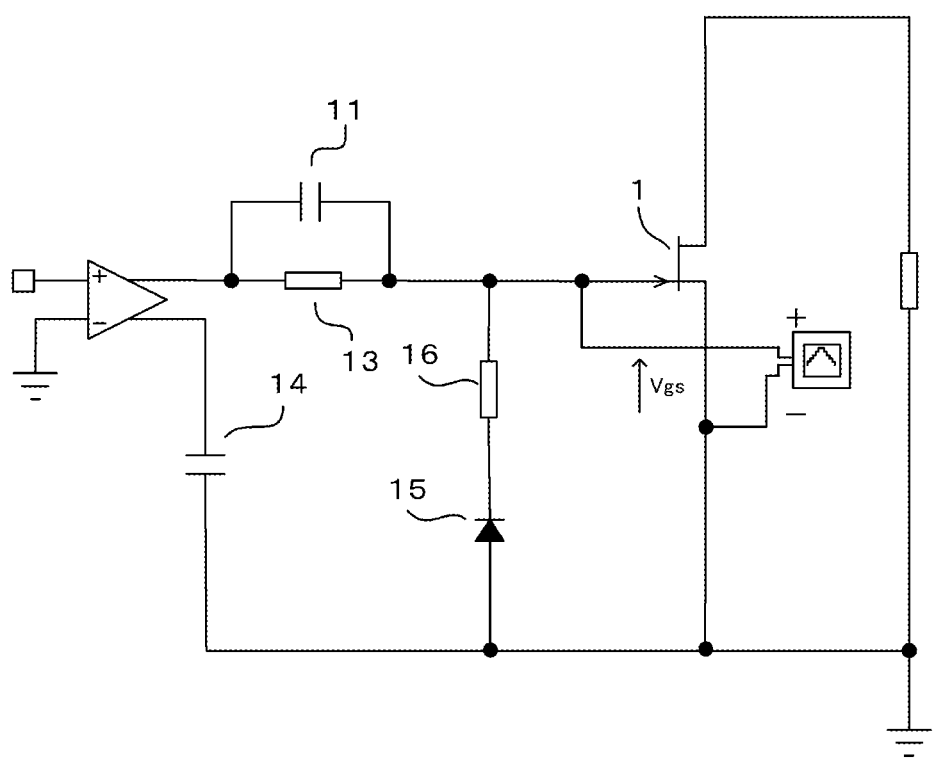
FIG. 15 is a diagram showing a model circuit for simulation.

A gate driving circuit shown in FIG. 15 was created as a model corresponding to the gate driving circuit 100 according to the first embodiment shown in FIG. 1, and a confirmation was made, using circuit simulator software, as to whether the negative bias voltage value can be changed in a manner that depends on a change in the duty cycle.

In the circuit simulator, a simulation was performed with the gate voltage set to 12 V, the drive frequency set to 70 kHz, the duty cycle set variable, the resistance value of the resistor 13 set to 82Ω, the resistance value of the resistor 16 set to 100Ω, the capacitance of the capacitor 11 set to 1 nF, and the capacitance of the capacitor 14 set to 100 nF.

Figure 16A:
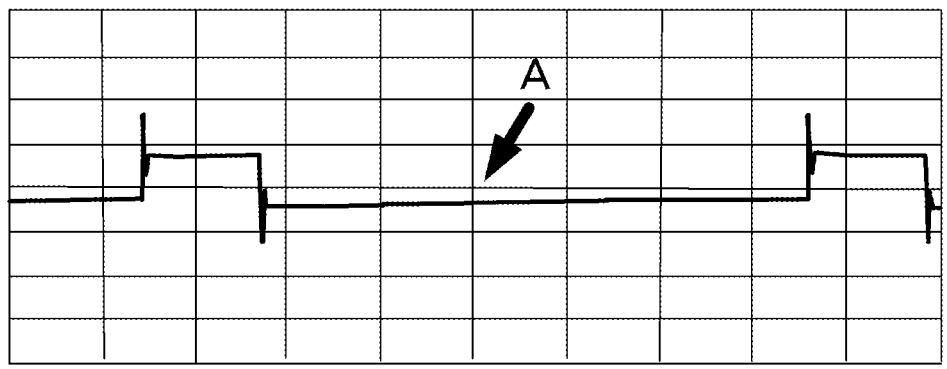
FIGS. 16A to 16D are graphs showing results of simulating a gate voltage applied to a switching element.
Figure 16B:
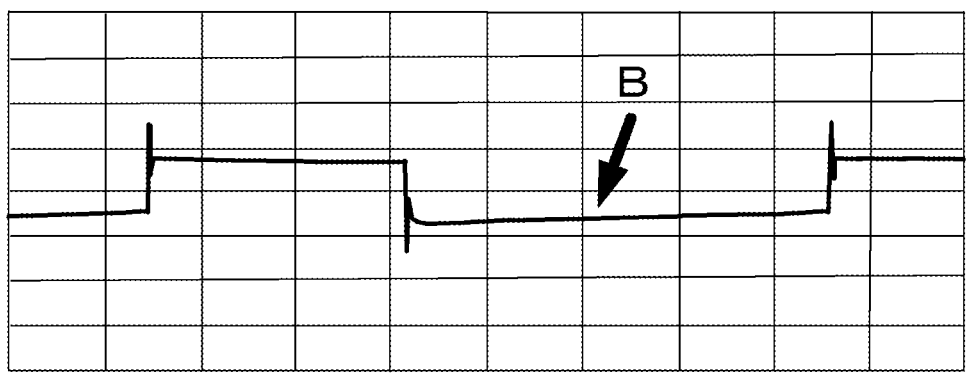
Figure 16C:
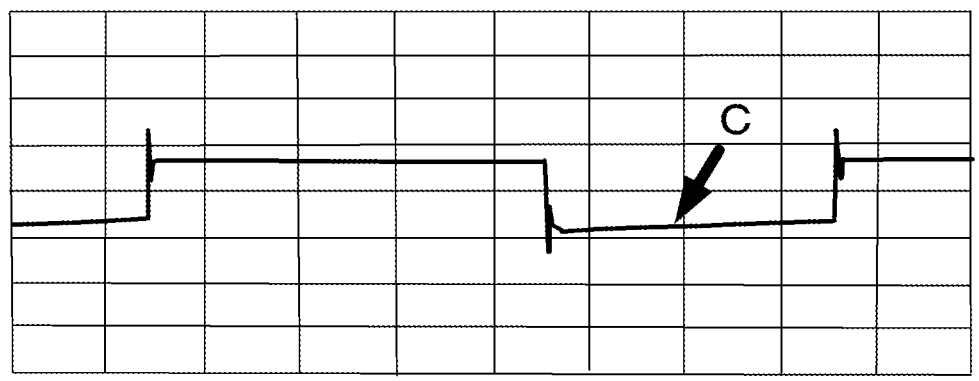
Figure 16D:
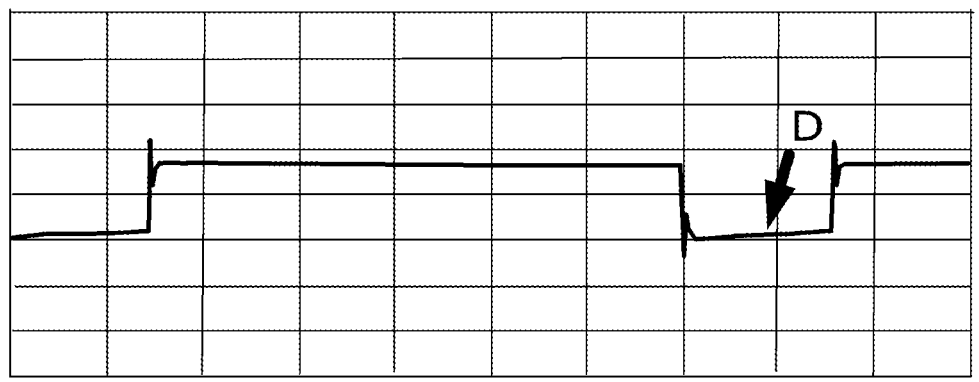

FIGS. 16A to 16D show waveforms representing results of simulating the gate-source voltage Vgs applied to the switching element. FIG. 16A shows a waveform when the duty cycle was set to 20%, FIG. 16B shows a waveform when the duty cycle was set to 40%, FIG. 16C shows a waveform when the duty cycle was set to 60%, and FIG. 16D shows a waveform when the duty cycle was set to 80%. A negative bias voltage value indicated by an arrow A in FIG. 16A was −1.8 V, a negative bias voltage value indicated by an arrow B in FIG. 16B was −2.8 V, a negative bias voltage value indicated by an arrow C in FIG. 16C was −3.7 V, and a negative bias voltage value indicated by an arrow D in FIG. 16D was −4.5 V.

It was thus confirmed, even with the simulation on the model circuit, that the negative bias voltage value can be changed in a manner that depends on a change in the duty cycle.

Next, using the above-described circuit simulator software, a confirmation was made as to whether the negative bias voltage value can be changed in a manner that depends on a change in the resistance value of the resistor 16 in the model circuit shown in FIG. 15.

Figure 17:
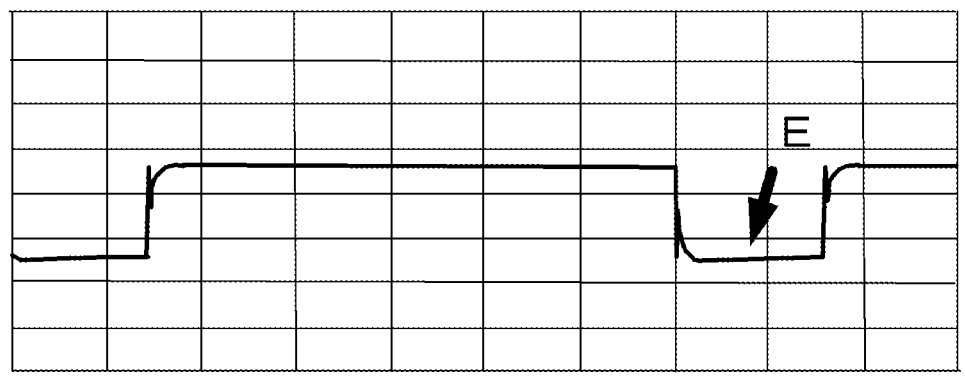
FIG. 17 is a graph showing a different result of simulating the gate voltage applied to the switching element.

Here, the duty cycle was set to 80%, and the same setting as described above was made except for the resistance value of the resistor 16. Simulations were performed when the resistance value of resistor 16 was set to 100Ω and when the resistance value was changed to 500Ω. The case where the resistance value of the resistor 16 was set to 100Ω is the same as shown in FIG. 16D. FIG. 16 shows a waveform representing a result of simulating the gate-source voltage Vgs applied to the switching element when the resistance value of the resistor 16 was set to 500Ω. As shown in FIG. 17, the negative bias voltage value indicated by an arrow E was −7.3 V.

It was thus confirmed, even with the simulation on the model circuit, that the negative bias voltage value can be significantly changed in a manner that depends on a change in the resistance value of the resistor 16.

Eighth Embodiment

Figure 18:
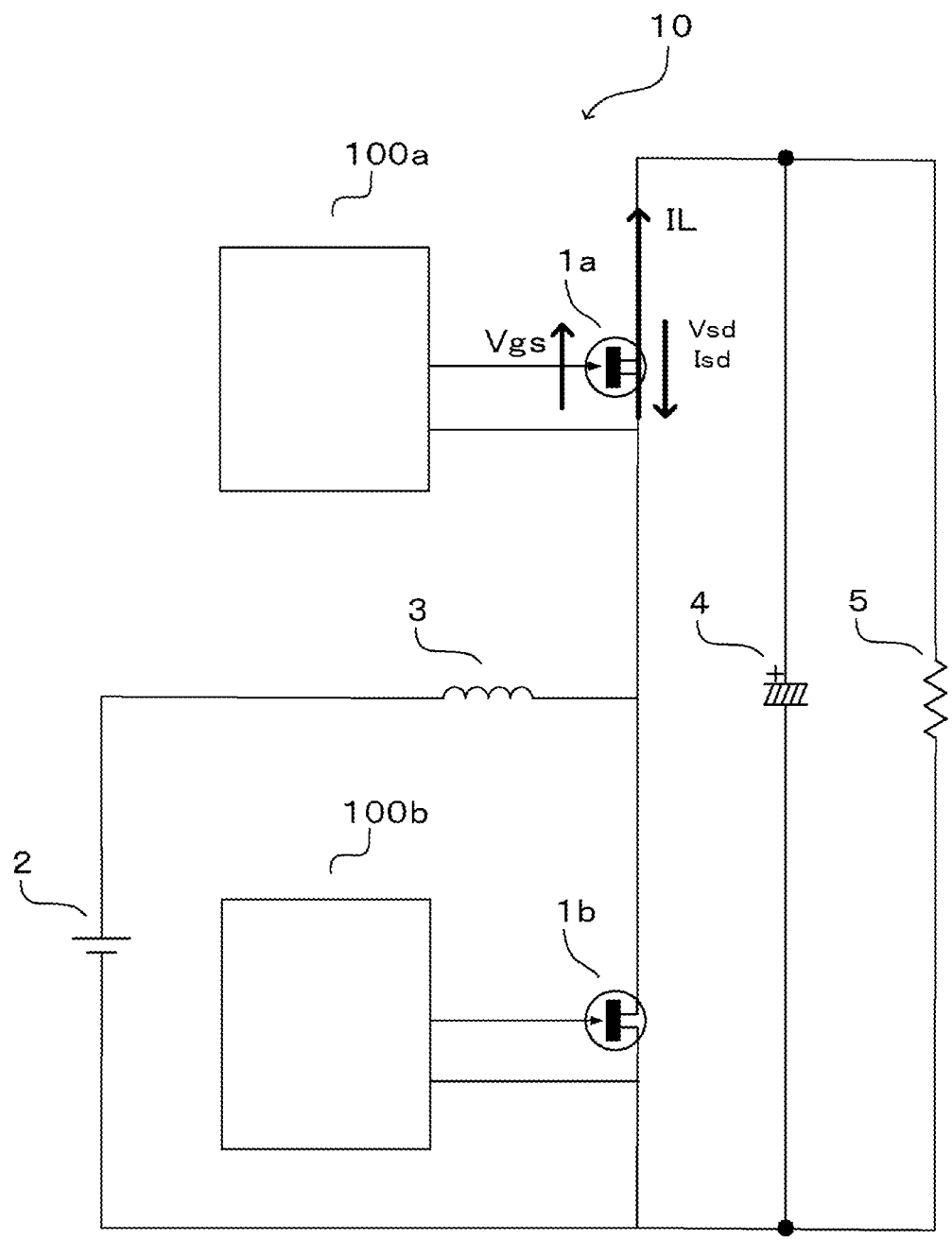
FIG. 18 is a diagram showing a circuit structure of a synchronous rectification boost chopper circuit according to an eighth embodiment.

FIG. 18 shows a synchronous rectification boost chopper circuit 10 according to an eighth embodiment.

The synchronous rectification boost chopper circuit 10 includes switching elements 1*a*, 1*b*, gate driving circuits 100*a*, 100*b*, an input power supply 2, a reactor 3, a bypass capacitor 4, a load 5, and the like. The gate driving circuit is not limited to the gate drive device according to the first embodiment, and the gate driving circuit according to another embodiment may be used. Since the function of the synchronous rectification boost chopper circuit 10 is known, no detailed description will be given of the synchronous rectification boost chopper circuit.

Figure 19A:
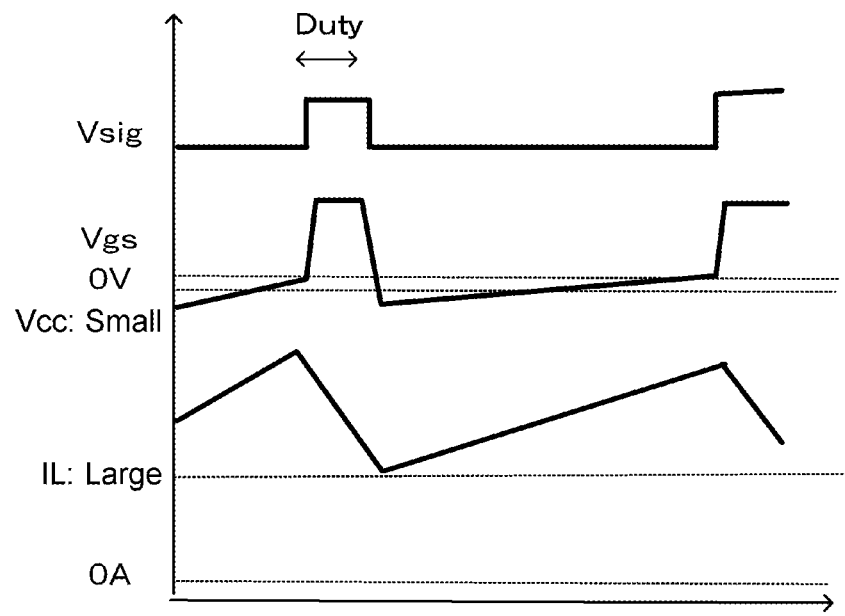
FIGS. 19A and 19B are graphs for describing the operation of the gate driving circuit with different duty cycles.
Figure 19B:
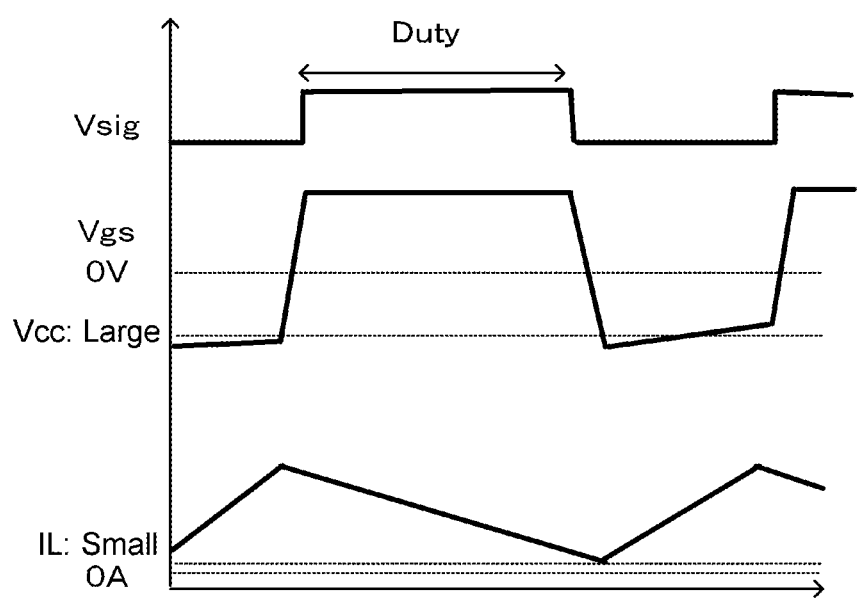

FIG. 19A shows a case where the duty cycle applied to the high-side switching element 1*a* is small, and FIG. 19B shows a case where the duty cycle applied to the high-side switching element 1*b* is large. As shown in FIG. 19A, when the duty cycle applied to the high-side switching element is small, a current IL becomes large. At this time, since the duty cycle is small, the negative bias voltage Vcc becomes small accordingly, thereby allowing a reduction in conduction loss. When the negative bias voltage (−Va) is applied to the switching element 1*a*, a conduction loss when the switching element 1*a* is in the off state is expressed by the following equation:

[Math. 10]

$$Vsd*Isd=(Vsd(@Vgs=0)+Va)*Isd$$

where, Vsd(@Vgs=0) denotes a value of Vsd when Vgs is zero, and Vcc denotes an average value of Va.

As can be seen from the above-described equation for conduction loss, even when the current IL is large, the conduction loss can be reduced through a reduction in the negative bias voltage Va, that is, Vcc. As shown in FIG. 19B, when the duty cycle applied to the high-side switching element is large, the negative bias voltage value Vcc applied to the switching element 1*a* increases, but in this case, the current IL becomes small, so that the effect of reducing the conduction loss is not impaired.

Further, even when noise is caused due to a switching operation of another switching element, a configuration where the negative bias voltage value is increased at required timing without increasing Vcc that is the average value of the negative bias voltage allows a reduction in loss while preventing malfunctions.

As described above, the use of the gate driving according to the embodiment as the gate driving circuit for the switching elements 1*a*, 1*b* of the synchronous rectification boost chopper circuit 10 allows a reduction in loss while preventing the switching elements 1*a*, 1*b* from malfunctioning. This in turn makes the synchronous rectification boost chopper circuit 10 high in reliability and efficiency.

Here, the synchronous rectification boost chopper circuit has been described as an example, but the switching circuit including a switching element driven by one of the gate driving circuits according to the embodiments of the present invention is applicable to not only the synchronous rectification boost chopper circuit, but also a DC/DC converter or an inverter.

Note that, in order to allow a comparison between the configuration requirement of the present invention and the configuration of each of the embodiments, the configuration requirement of the present invention will be described with the reference numerals used in the drawings.

<First Invention>

A driving circuit for a switching element (100, 200, 300, 400, 500, 600, 700) configured to drive a switching element (1) includes a controller (12) having a first terminal (123) and a second terminal (124), the controller (12) being configured to output a control signal to a gate terminal of the switching element (1), a first resistor (13) connected to the first terminal (123) of the controller (12), the first resistor (13) regulating a current serving as the control signal, a first capacitor (11) connected in parallel to the first resistor (13), a second capacitor (14), a second resistor (16), a diode (15) connected in series with the second resistor (16), and a current path extending from the first resistor (13) and the first capacitor (11) to the gate terminal and from a source terminal of the switching element (1) to the second terminal (124) of the controller (12), the second capacitor (14) is put in the path extending from the source terminal to the controller (12), and the diode connected in series with the second resistor has a cathode terminal connected to a path extending from the first resistor (13) and the first capacitor (11) to the gate terminal and an anode terminal connected to a path extending from the source terminal to the second capacitor.

<Second Invention>

In the driving circuit for a switching element according to the first invention, when a capacitance of the first capacitor (11) is denoted by C1, a capacitance of the second capacitor (14) is denoted by C2, an input capacitance of the switching element (1) is denoted by Ciss, a source voltage of the control signal is denoted by Vdd, a gate-source voltage when the switching element (1) is in a turn-on state is denoted by Vdev, and a negative bias voltage applied to the switching element is denoted by Vcc, $$\frac{1}{Ciss} * \frac{1}{\left(\frac{1}{C1} + \frac{1}{C2} + \frac{1}{Ciss}\right)} < \frac{Vcc + Vdev}{Vdd} \quad [\text{Math. 11}]$$

is satisfied.

<Third Invention>

The driving circuit for a switching element according to the first or second invention further includes a third resistor (17) connected between the gate terminal and the source terminal of the switching element (1).

<Fourth Invention>

In the driving circuit for a switching element according to the third invention, the switching element (1) is of either a current-driven type or a voltage-driven type.

<Fifth Invention>

The driving circuit for a switching element according to the first or second invention further includes a third capacitor (18) connected between the gate terminal and the source terminal of the switching element (1).

<Sixth Invention>

The driving circuit for a switching element according to the first or second invention further includes a mirror clamping circuit (20) provided in parallel to a path including the switching element (1) and the second capacitor (14).

<Seventh Invention>

The driving circuit for a switching element according to the first or second invention further includes a fourth resistor (21) connected to the path in series with the first capacitor (11) and in parallel to the first resistor (13).

<Eighth Invention>

The driving circuit for a switching element according to the first or second invention further includes a Schottky diode (22) having a cathode terminal connected to a path adjacent to the first resistor (13) and the first capacitor (11) and an anode terminal connected to a path adjacent to the controller (12), relative to the second resistor (14) and the switching element (1).

<Ninth Invention>

The driving circuit for a switching element according to the first or second invention further includes a voltage clamping unit (23) connected in parallel to the switching element (1), the voltage clamping unit being configured to fix a voltage to a predetermined voltage.

<Tenth Invention>

A switching circuit includes a plurality of switching elements (1) connected in series and the driving circuit for a switching element (100, 200, 300, 400, 500, 600, 700) according to any one of the first to ninth inventions configured to drive each of the plurality of switching elements.

DESCRIPTION OF SYMBOLS 1 switching element
10 synchronous rectification boost chopper circuit
11, 14, 18 capacitor
12 driving circuit
123 Vout end
124 Vee end
13, 16, 17, 21 resistor
15 diode
20 switching element
22 temperature detector
23 Zener diode
100, 200, 300, 400, 500, 600, 700 gate driving circuit

The invention claimed is:

1. A driving circuit for a switching element configured to drive a switching element, the driving circuit for a switching element comprising:
   a controller comprising a first terminal and a second terminal, the controller being configured to output a control signal to a gate terminal of the switching element;
   a first resistor connected to the first terminal of the controller, the first resistor regulating a current serving as the control signal;
   a first capacitor connected in parallel to the first resistor;
   a second capacitor;
   a second resistor;
   a diode connected in series with the second resistor; and
   a current path extending from the first resistor and the first capacitor to the gate terminal and from a source terminal of the switching element to the second terminal of the controller, wherein
   the second capacitor is put in the path extending from the source terminal to the controller, and
   the diode connected in series with the second resistor comprises a cathode terminal connected to a path extending from the first resistor and the first capacitor to the gate terminal and an anode terminal connected to a path extending from the source terminal to the second capacitor.

2. The driving circuit for a switching element according to claim 1, wherein
   when a capacitance of the first capacitor is denoted by C1, a capacitance of the second capacitor is denoted by C2, an input capacitance of the switching element is denoted by Ciss, a source voltage of the control signal is denoted by Vdd, a gate-source voltage when the switching element is in a turn-on state is denoted by Vdev, and a negative bias voltage applied to the switching element is denoted by Vcc, $$\frac{1}{C_{iss}} * \frac{1}{\left(\frac{1}{C1} + \frac{1}{C2} + \frac{1}{C_{iss}}\right)} < \frac{V_{cc} + V_{dev}}{V_{dd}} \quad \text{[Math. 1]}$$

is satisfied.

3. The driving circuit for a switching element according to claim 1, further comprising a third resistor connected between the gate terminal and the source terminal of the switching element.

4. The driving circuit for a switching element according to claim 3, wherein
the switching element is of either a current-driven type or a voltage-driven type.

5. The driving circuit for a switching element according to claim 1, further comprising a third capacitor connected between the gate terminal and the source terminal of the switching element.

6. The driving circuit for a switching element according to claim 1, further comprising a mirror clamping circuit provided in parallel to a path comprising the switching element and the second capacitor.

7. The driving circuit for a switching element according to claim 1, further comprising a fourth resistor connected to the path in series with the first capacitor and in parallel to the first resistor.

8. The driving circuit for a switching element according to claim 1, further comprising a Schottky diode comprising a cathode terminal connected to a path adjacent to the first resistor and the first capacitor and an anode terminal connected to a path adjacent to the controller, relative to the second resistor and the switching element.

9. The driving circuit for a switching element according to claim 1, further comprising a voltage clamping unit connected in parallel to the switching element, the voltage clamping unit being configured to fix a voltage to a predetermined voltage.

10. A switching circuit comprising:
a plurality of switching elements connected in series; and
the driving circuit for a switching element according to claim 1 configured to drive each of the plurality of switching elements.

\* \* \* \* \*